(12) United States Patent
Park et al.

(10) Patent No.: US 10,951,221 B2
(45) Date of Patent: Mar. 16, 2021

(54) TESTING AN ANALOG-TO-DIGITAL CONVERTER USING COUNTERS

(71) Applicant: Regents of the University of Minnesota, Minneapolis, MN (US)

(72) Inventors: Gyusung Park, Saint Paul, MN (US); Hyung-il Kim, Woodbury, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 16/736,214

(22) Filed: Jan. 7, 2020

(65) Prior Publication Data

US 2020/0328751 A1 Oct. 15, 2020

Related U.S. Application Data

(60) Provisional application No. 62/832,088, filed on Apr. 10, 2019.

(51) Int. Cl.
*H03M 1/10* (2006.01)
(52) U.S. Cl.
CPC .................. *H03M 1/1071* (2013.01)
(58) Field of Classification Search
CPC .................................................. H03M 1/1071
USPC ......................................................... 341/155
See application file for complete search history.

(56) References Cited

U.S. PATENT DOCUMENTS

| | | | | | |
|---|---|---|---|---|---|
| 4,354,177 | A | * | 10/1982 | Sloane ................ | H03M 1/1071 341/120 |
| 4,667,296 | A | * | 5/1987 | Crowe ............... | G01R 31/2837 341/118 |
| 6,668,347 | B1 | * | 12/2003 | Babella .......... | G01R 31/318536 714/730 |
| 8,169,517 | B2 | * | 5/2012 | Poonnen ............. | H04N 5/3765 348/294 |
| 10,616,571 | B2 | * | 4/2020 | Chae ................... | H03M 1/1071 |

OTHER PUBLICATIONS

Park et al., "A Counter based ADC Non-Linearity Measurement Circuit and Its Application to Reliability Testing," IEEE, 2019 IEEE Custom Integrated Circuit Conference (CICC), Apr. 14-17, 2019, 4 pp.
Kull et al., "A 90GS/s 8b 667mW 64x Interleaved SAR ADC in 32nm Digital SOI CMOS," ResearchGate, ISSCC, 2014 IEEE International Solid-State Circuit Conferences, Feb. 12, 2014, pp. 378-380.
Yilmaz et al., "Modeling of NBTI-Recovery Effects in Analog CMOS Circuits," ResearchGate, IEEE, 2013 IEEE International Conference: Reliability Physics Symposium (IRPS), Apr. 2013, 4 pp.
"IEEE Standard for Terminology and Test Methods for Analog-to-Digital Converters," IEEE Standards Association, IEEE Instrumentation & Measurement Society, Revision of IEEE Std 1240-2000, Jan. 14, 2011, 139 pp.

(Continued)

*Primary Examiner* — Peguy Jean Pierre
(74) *Attorney, Agent, or Firm* — Shumaker & Sieffert, P.A.

(57) ABSTRACT

In some examples, a device includes an analog-to-digital converter (ADC) configured to receive an analog signal and output digital codes based on values of the analog signal. The device also includes a plurality of counters, where each counter of the plurality of counters is configured to increment in response to a respective digital code outputted by the ADC.

20 Claims, 20 Drawing Sheets

(56) References Cited

OTHER PUBLICATIONS

Choi et al., "Circuit Techniques for Mitigating Short-Term Vth Instability Issues in Successive Approximation Register (SAR) ADCs," Custom Integrated Circuits Conference (CICC), Applicant points out, in accordance with MPEP 609.04 (a), that the year of publication, 2015, is sufficiently earlier than the effective U.S. filing date, so that the particular month of publication is not in issue, 4 pp.
Staller, "Understanding analog to digital converter specifications," Embedded Systems Design, accessed from https://www.embedded.com/understanding-analog-to-digital-converter-specifications/, Feb. 24, 2005, accessed on Jun. 4, 2020, 11 pp.
Kull et al., "Measurement of High-Speed ADCs," IEEE, 2017 Custom Integrated Circuits Conference (CICC), Apr. 30-May 3, 2017, 7 pp.

\* cited by examiner

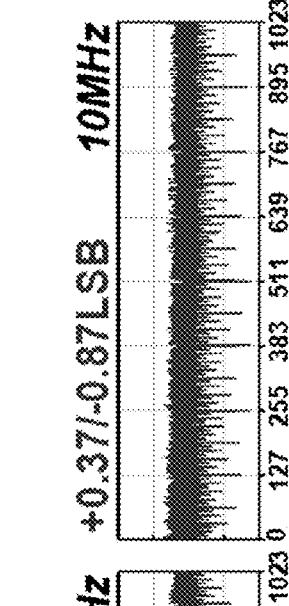
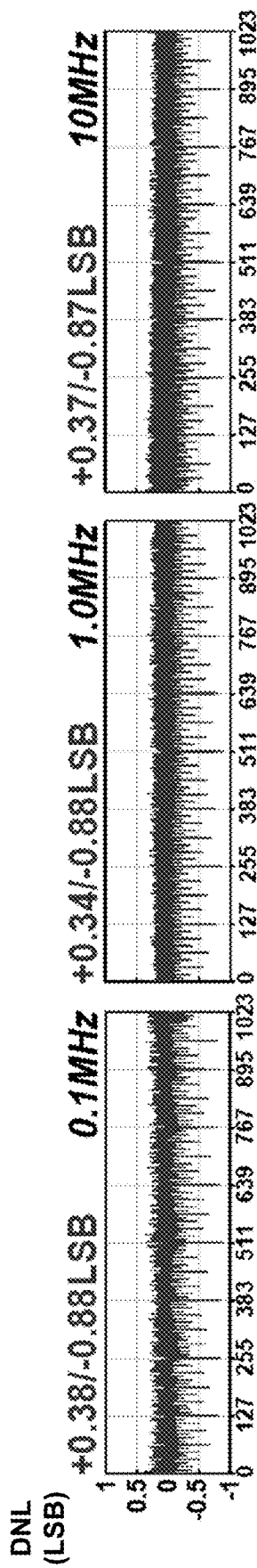
FIG. 6A   FIG. 6B   FIG. 6C
FIG. 6D   FIG. 6E   FIG. 6F

| Vulnerable codes | | Conv. step w/ error |
|---|---|---|
| Decimal value | Binary D9 D8 D7 D6 D5 D4 | |
| 127 =<br>128 = | 0 0 0 1 1 1<br>0 0 1 0 0 0 | D7 |
| 255 =<br>256 = | 0 0 1 1 1 1<br>0 1 0 0 0 0 | D8 |
| 383 =<br>384 = | 0 1 0 1 1 1<br>0 1 1 0 0 0 | D7 |
| 639 =<br>640 = | 1 0 0 1 1 1<br>1 0 1 0 0 0 | D7 |
| 767 =<br>768 = | 1 0 1 1 1 1<br>1 1 0 0 0 0 | D8 |
| 895 =<br>896 = | 1 1 0 1 1 1<br>1 1 1 0 0 0 | D7 |

FIG. 12

| Process | 65nm GP CMOS |
|---|---|
| Core / IO supply | 1.2V / 2.5V |
| ADC resolution | 10-bit |
| DNL (max) vs Con. (w/o SRAM) | 0.88 LSB (1.23 LSB improv.) |
| Read Out Data Volume vs Con. | 1/64 (for 32 samples/code) |
| Tr. count of on-chip measurement block | 94,208 (Counters only) |
| DNL | +0.34 / -0.88 LSB @ 1MHz |
| INL | +1.67 / -1.41 LSB @ 1MHz |
| Total chip area | 0.57mm$^2$ |

TESTING AN ANALOG-TO-DIGITAL CONVERTER USING COUNTERS

This application claims the benefit of U.S. Provisional Patent Application No. 62/832,088 (filed Apr. 10, 2019), the entire content being incorporated herein by reference.

BACKGROUND

Characterizing analog-to-digital converters (ADCs) is a challenging task because the performance of an ADC is sensitive to the noise in the measurement setup. Examples of performance metrics that matter to ADC designers include: differential non-linearity (DNL), integral non-linearity (INL), signal to noise and distortion ratio (SNDR), effective number of bits (ENOB), spurious free dynamic range (SFDR), and dynamic range. Among these metrics, DNL and INL are the standard linearity parameters which are obtained from a histogram of the ADC codes for a slow triangular input voltage signal. The frequency of the triangular signal during a non-linearity test should be low enough to avoid any settling time issues.

In the ideal case, all ADC codes appear the same number of times during a non-linearity test. In reality, however, some codes may have a higher or lower count than the ideal count due to non-linearity in the circuit and/or due to noise effects. Plotting the deviation of the actual count from the ideal count for each ADC code gives the DNL distribution. Integrating the DNL up to a certain code gives the INL distribution. Although measuring DNL or INL is not enough to fully characterize an ADC for some high-speed applications, the DNL and INL measurements are highly relevant metrics for a wide range of ADCs.

SUMMARY

This disclosure describes a counter-based measurement circuit for testing the differential non-linearity (DNL) and integral non-linearity (INL) of an analog-to-digital converter (ADC). A plurality of counters stores the counts for the digital codes outputted by the ADC during the non-linearity testing. Each counter is configured to increment in response to a particular digital code outputted by the ADC. In some examples, the circuit includes a decoder that causes a corresponding counter to increment in response to the digital code outputted by the ADC. The counters can transfer the stored counts to an external circuit during a pause in the non-linearity testing. Rather than storing each code generated by the ADC along with metadata (e.g., timestamps), a measurement circuit of this disclosure may store only a count of the number of times that the ADC generated each code.

BRIEF DESCRIPTION OF DRAWINGS

FIGS. 6A-6C are graphs of the non-linearity for a measurement circuit including counters.

FIGS. 6D-6F are graphs of the non-linearity for a measurement circuit without counters or on-chip memory.

FIG. 12 is a table showing the digital codes that are most vulnerable to short-term BTI effects in a ten-bit SAR-ADC.

DETAILED DESCRIPTION

A measurement circuit including an analog-to-digital converter (ADC) may be configured to test the differential non-linearity (DNL) and the integral non-linearity (INL) of the ADC. During the non-linearity testing, the ADC repeatedly converts the test signal into digital codes as the value (e.g., voltage or current) of the test signal varies over time. The measurement circuit stores the results of the testing, which can be a histogram of the number of times that the ADC outputted each digital code.

Figure 1A:
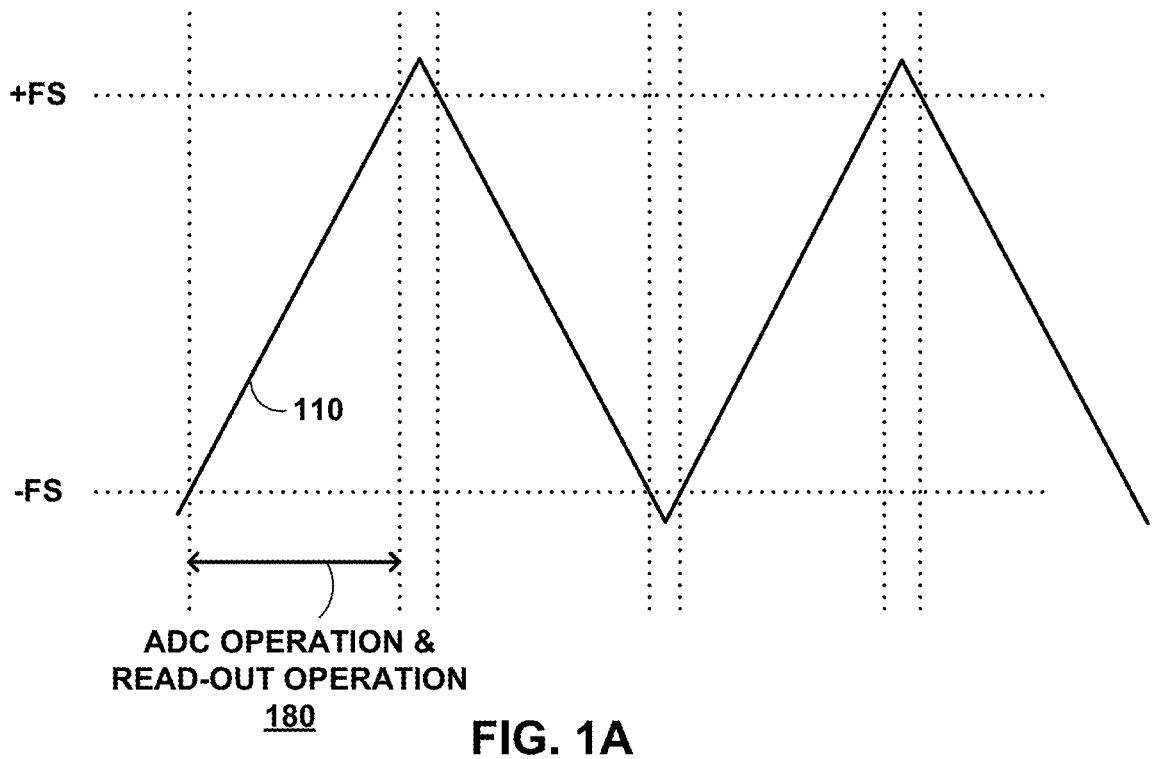
FIGS. 1A and 1B show a test signal and a first example measurement circuit for handling the results of non-linearity testing.
Figure 1B:
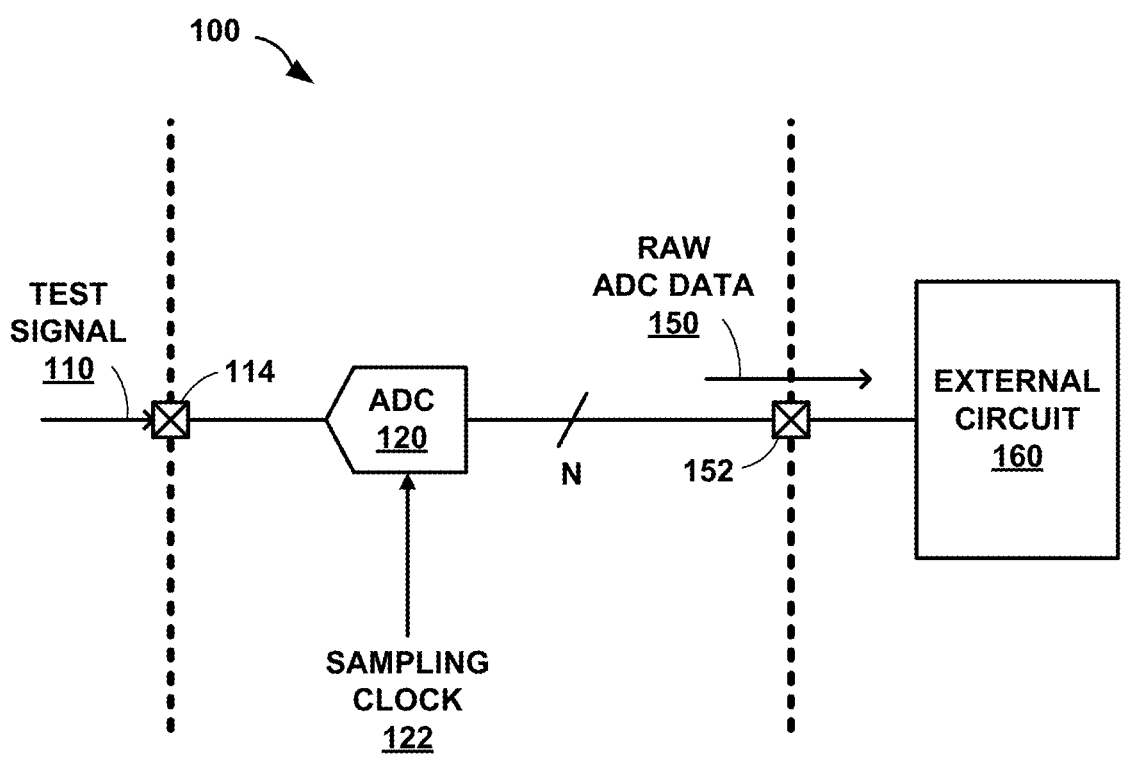

FIGS. 1A and 1B show a first test signal 110 and a first example measurement circuit 100 for handling the results of non-linearity testing. External circuit 160 shown in FIG. 1B continuously retrieves raw ADC data 150 from ADC 120 while ADC 120 receives and converts test signal 110. ADC 120 outputs raw ADC data 150 to external circuit 160, which may be a host computer, a processor, and/or a diagnostic test device configured to analyze raw ADC data 150. The techniques of this disclosure can be used in ADCs for communication systems, electronic instruments, testing equipment, sensors, embedded systems, and any other system or device. The in-situ circuits described herein can be attractive for characterizing high-resolution ADCs or studying subtle shifts in ADC performance.

FIG. 1A shows test signal 110 as a slow ramp voltage that is provided as the input to ADC 120. Measurement circuit 100 receives test signal 110 at interface 114, and ADC 120 performs a conversion of the analog value of test signal 110 to a digital code in accordance with sampling clock 122. For example, ADC 120 can convert test signal 110 to an N-bit digital code at each rising edge or falling edge of sampling clock 122, where N is an integer that represents the resolution of ADC 120. ADC 120 outputs the digital codes as raw ADC data 150 to external circuit 160 during ADC operation and read-out operation 180. Thus, measurement circuit 100 concurrently performs non-linearity testing and outputs raw ADC data 150 during ADC operation and read-out operation 180.

The measurement circuit shown in FIG. 1B does not require any special circuits, but high-speed digital interface 152 can generate significant noise in the measurement setup. The input-output (IO) signals are switching at a high frequency while the ADC is performing the sensitive analog to digital conversion. The high-frequency IO signals can cause significant electromagnetic noise, which can affect (e.g., corrupt) the performance of ADC 120 and the conversion results. Consequently, measurement circuit 100 may not be suitable for characterizing high resolution ADCs or studying subtle shifts in ADC performance.

Figure 2A:
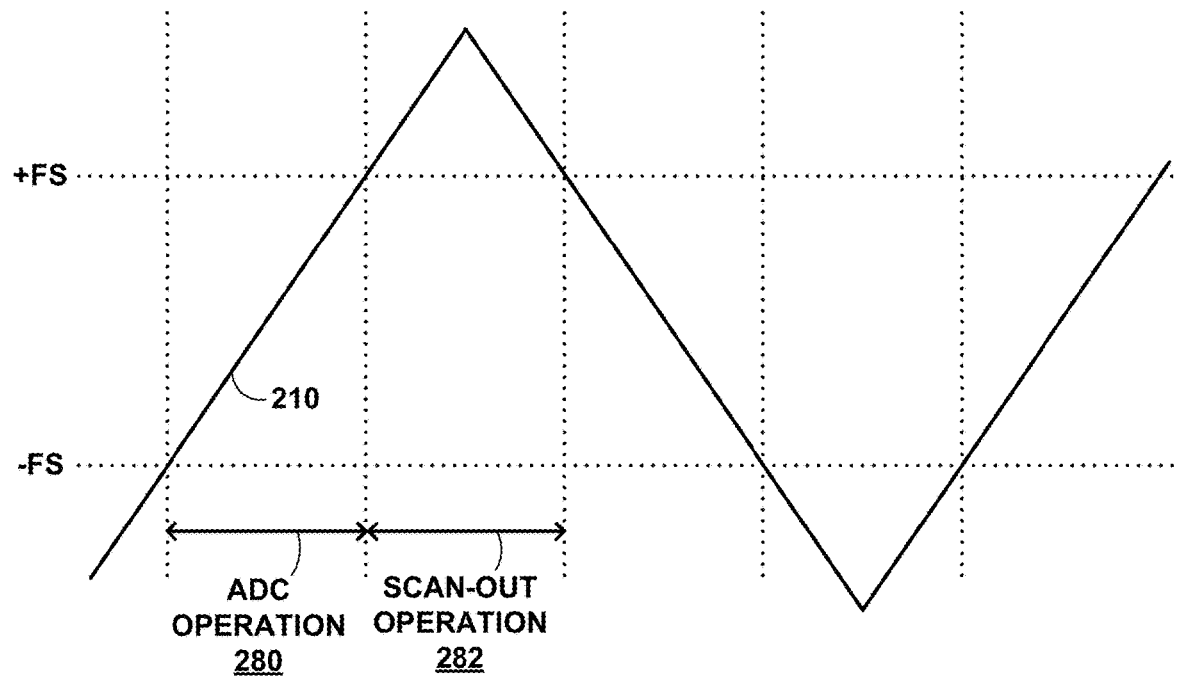
FIGS. 2A and 2B show a second test signal and a second example measurement circuit for handling the results of non-linearity testing.
Figure 2B:
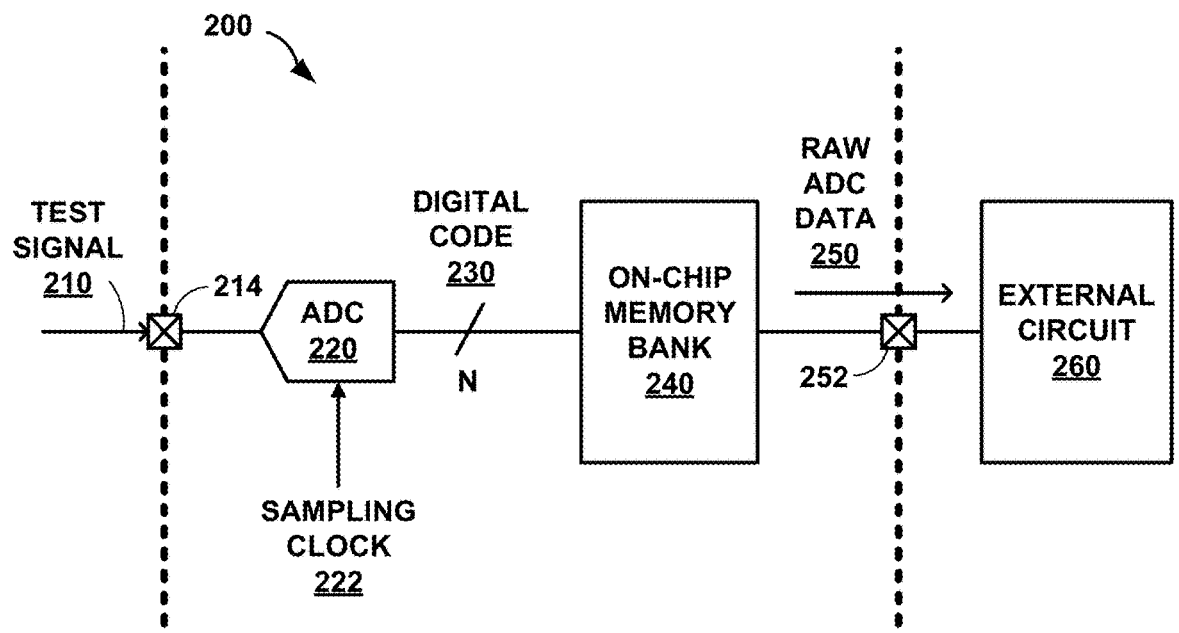

Measurement circuit 200 shown in FIG. 2B may reduce or eliminated the noise caused by interface 252 and experienced by ADC 220, as compared to measurement circuit 100, by outputting raw ADC data 250 to external circuit 260 only during pauses in the testing operation. By having memory bank 240 on the chip, measurement circuit 200 can obviate concerns about the noise generated off the chip during ADC operation 280.

FIGS. 2A and 2B show a second test signal 210 and a second example measurement circuit 200 for handling the results of non-linearity testing. Measurement circuit 200 receives test signal 210 at interface 214 and converts an analog value of test signal 210 to N-bit digital code 230 based on sampling clock 222. Measurement circuit 200 stores digital code 230 to on-chip memory bank 240 and later transfers to external circuit 260 as raw ADC data 250. The arrangement of measurement circuit 200 separates the operation of ADC 220 from the data transfer operation at digital interface 252, making the ADC characterization immune to measurement noise. However, measurement circuit 200 uses a significant amount of on-chip memory, as large as one megabit, to fully characterize ADC 220.

Furthermore, the amount of data that measurement circuit 200 transfers to external circuit 260 can be very large. On-chip memory bank 240 may be configured to store each result from the testing. In examples in which ADC 220 has a resolution of twelve bits, and each digital code is tested one hundred times, ADC 220 may store four million bits of data during ADC operation 280 before outputting the data during scan-out operation 282. Scan-out operation 282 occurs when test signal 210 is outside of a range of the positive full-scale (FS) voltage and the negative FS voltage. In some examples, on-chip memory bank 240 is configured to store a timestamp for each test result, which increases the number of memory cells in on-chip memory bank 240. In examples in which on-chip memory bank 240 includes static random access memory (SRAM), Equation (1) shows the number transistors for on-chip memory bank 240 in an example with twelve bits of resolution, and thirty-two samples at each code. On-chip memory bank 240 may have six transistors for each bit of memory.

$$(2^{12} \text{ codes}) \times (32 \text{ samples at each code}) \times (10 \text{ bits stored for each sample}) \times (6 \text{ transistors per bit of memory}) = 7{,}853{,}320 \text{ transistors} \quad (1)$$

Figure 3A:
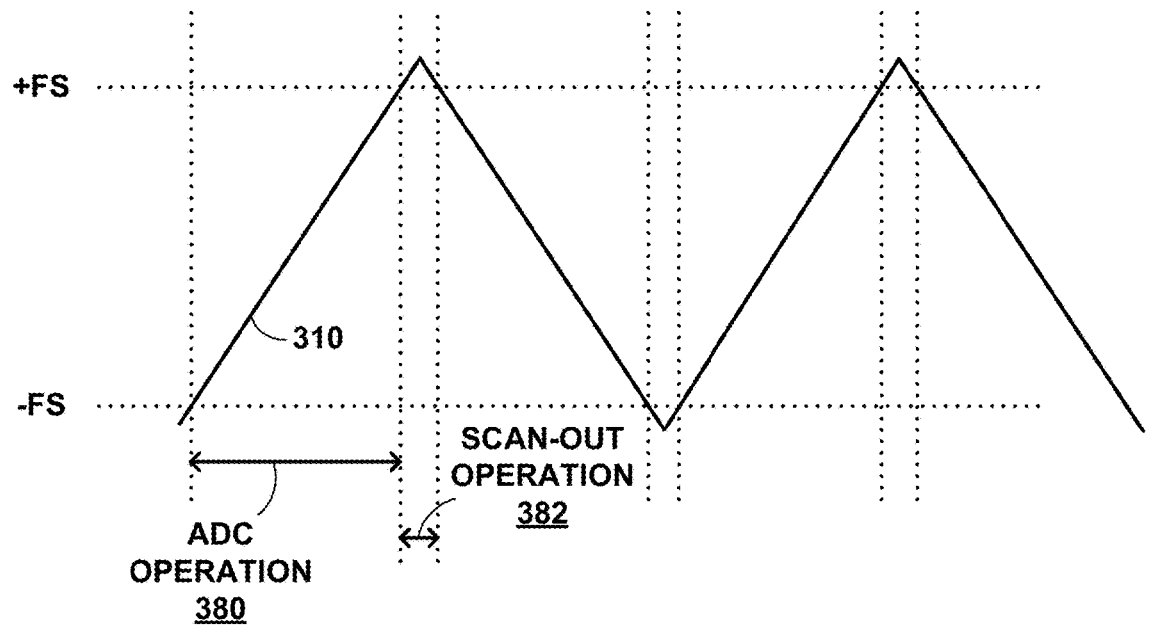
FIGS. 3A and 3B show a test signal and a measurement circuit including counters for storing a non-linearity histogram.
Figure 3B:
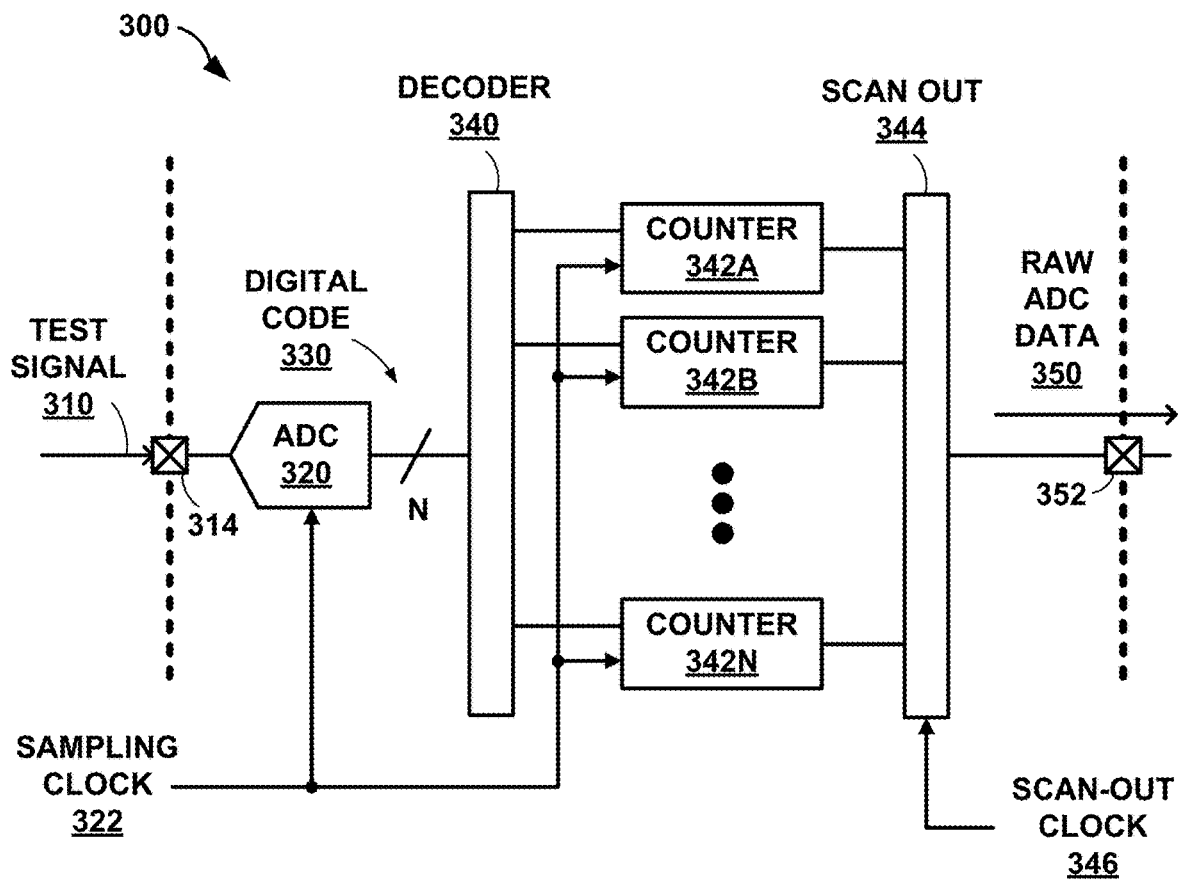

In accordance with the techniques of this disclosure, measurement circuit 300 includes counters 342A-342N for storing a count of each digital code, as shown in FIG. 3B. Each of counter 342A-342N can store a count for a respective digital code output by ADC 320 during non-linearity testing. The transistor count for counters 342A-342N may be significantly less than the transistor count for on-chip memory bank 240 shown in FIG. 2B. Moreover, storing the test results in counters 342A-342N during ADC operation 380 to output during scan-out operation 382, which occurs during a pause in ADC operation 380, eliminates the effect of the noise on the operation of ADC 320 during ADC operation 380.

FIGS. 3A and 3B show a test signal and a measurement circuit including counters for storing a non-linearity histogram. As shown in the example of FIG. 3B, measurement circuit 300 includes decoder block 340 and array of counters 342A-342N. Decoder 340 decodes each digital code output by ADC 320, and decoder 340 enables a corresponding one of counters 342A-342N and increments a value of the corresponding counter. In some examples, each of counters 342A-342N includes five bits, for a maximum count of thirty-two. The design choice of sizing of each of counters 342A-342N is based on the area overhead, ADC ramp time, and the target number of samples. For example, a larger counter uses a larger area, but the larger counter allows for a slower ramp signal and can collect more samples before transferring the counter values to an external circuit. To prevent the counter from overflowing, the ramp signal should have a period shorter than $2^N \times$max count$\times$sampling period, where N is an integer representing the resolution of ADC 320. Storing counts, rather than raw ADC codes, reduces the amount of data that needs to be transferred off-chip. This allows the data transfer to occur briefly between the signal ramp up and ramp down (e.g., during scan-out operation 382). Since ADC operation 380 and scan-out operation 382 are separated in time, measurement circuit 300 can test ADC 320 in an extremely low noise environment.

During ADC operation 380, measurement circuit 300 receives test signal 310 at interface 314. ADC 320 converts test signal 310 to N-bit digital code 330 based on sampling clock 322. For example, sampling clock 322 may cause ADC 320 to sample test signal 310 at a frequency of one hundred kilohertz or one megahertz, where test signal 310 has a much lower frequency, such as one, ten, or one hundred hertz. Decoder 340 receives digital code 330 and causes a corresponding one of counters 342A-342N to increment. During scan-out operation 382, scan-out circuit 344 outputs raw ADC data 350 stored by counters 342A-342N to digital interface 352. An external circuit such as a host computer or a testing instrument can connect to digital interface 352 to receive raw ADC data 350.

Measurement circuit 300 can store the results of non-linearity testing in counters 342A-342N with much less space as compared to on-chip memory bank 240 used in measurement circuit 200. In examples in which each of counters 342A-342N includes five D flip-flops, Equation (2) shows the number transistors for counters 342A-342N in an example with twelve bits of resolution, and one hundred samples at each code. Counters 342A-342N may have thirty-two transistors for each D flip-flop.

$$(2^{12} \text{ codes}) \times (5 \text{ flip flops for each code}) \times (32 \text{ transistors per flip flop}) = 655{,}360 \text{ transistors} \quad (1)$$

Comparing Equation (2) to Equation (1) above, on-chip memory bank 240 of measurement circuit 200 has a much higher transistor count than counters 342A-342N of measurement circuit 300 by a twelve-to-one ratio. Measurement circuit 300 may have a lighter weight by employing a bank of counters for precise DNL and INL characterization. Measurements circuit 300 may be immune to measurement noise as ADC operation 380 and scan-out operation 382 are separated in time. Compared to measurement circuit 200 shown in FIG. 2B, the design of measurement circuit 300 can be simpler and more compact because counters 342A-342N store only the count values on-chip. The test-time overhead of measurement circuit 300 is negligible compared to the test-time overhead of measurement circuit 200. Measurement circuit 300 can make measuring short-term reliability effects in a ten-bit successive approximation register (SAR) ADC easier, as compared to measurement circuit 300.

Measurement circuit 300 may include a large number of counters 342A-342N needed to measure the full histogram of digital codes 330. For example, the number of counters 342A-342N may be $2^N$ for an N-bit ADC, which can be a significant area overhead for measurement circuit 300. To make the circuit area smaller and more tractable, measurement circuit 400 has a two-way interleaved design with only half the number of counters 442A-442N. To measure the full DNL and INL histograms with half the number of counters of counters 342A-342N, measurement circuit 400 measures the odd codes and even codes in two separate tests and combine the results later.

Figure 4A:
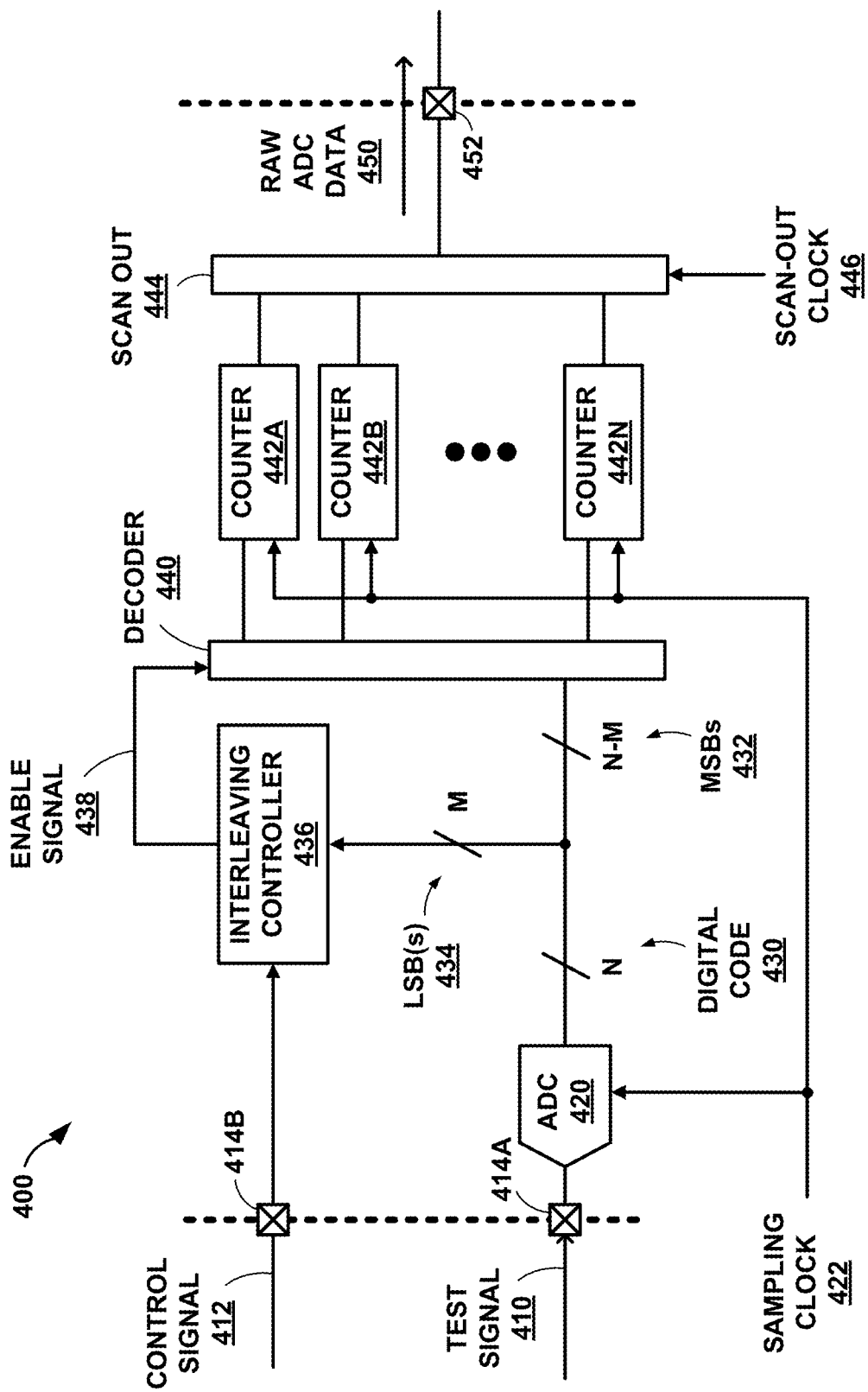
FIG. 4A is a block diagram of a measurement circuit including an interleaved design.

FIG. 4A is a block diagram of a measurement circuit including an interleaved design. Interleaving controller 436 enables decoder 440 using enable signal 438 only when least significant bit(s) (LSB(s)) 434 of digital code 430 matches control signal 412. In response to determining that LSB(s) 434 do not match the bit(s) of control signal 412, interleaving controller 436 can send a disable signal (e.g., a disabling value of enable signal 438) to decoder 440. Control signal 412 may be a binary signal with a first value indicating odd values of digital code 430 and a second value indicating even values of digital code 430. Interleaving controller 436 can receive control signal 412 from interface 414B with M bits. In examples in which M equals one, interleaving controller 436 outputs enable signal 438 based on whether control signal 412 matches LSB 434. Using a two-way interleaved design where M equals one reduces the circuit area of counters 442A-442N by fifty percent, as compared to the circuit area of counters 342A-342N.

In examples in which M is greater than one, interleaving controller 436 outputs enable signal 438 based on whether each bit of control signal 412 matches each bit of LSBs 434. Thus, measurement circuit 400 can have a smaller number of counters 442A-442N than measurement circuit 300 by a factor of $2^M$. Four-way, eight-way, or any other multiple-way interleaved designs can be especially useful for testing ADCs with higher number of bits (e.g., twelve or more bits). Moreover, interleaved designs can reduce the circuit area by $2^M$, as compared to a design where M equals one. However, the interleaved design comes at the expense of performing $2^M$ ramp tests.

Figure 4B:
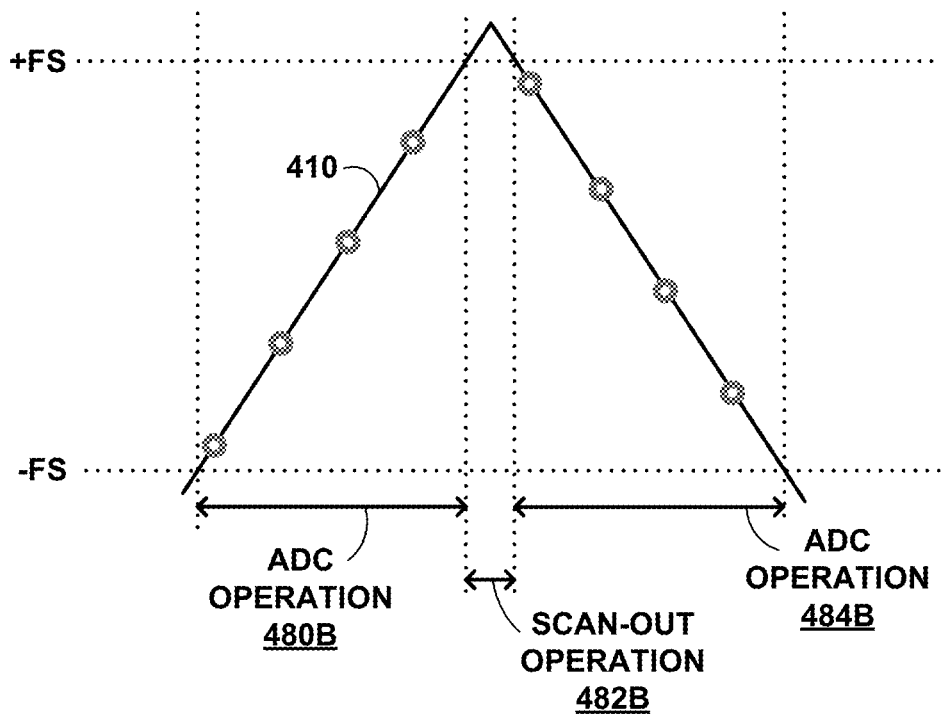
FIGS. 4B and 4C are graphs of odd and even codes for two tests of a test signal using an interleaved design.
Figure 4C:
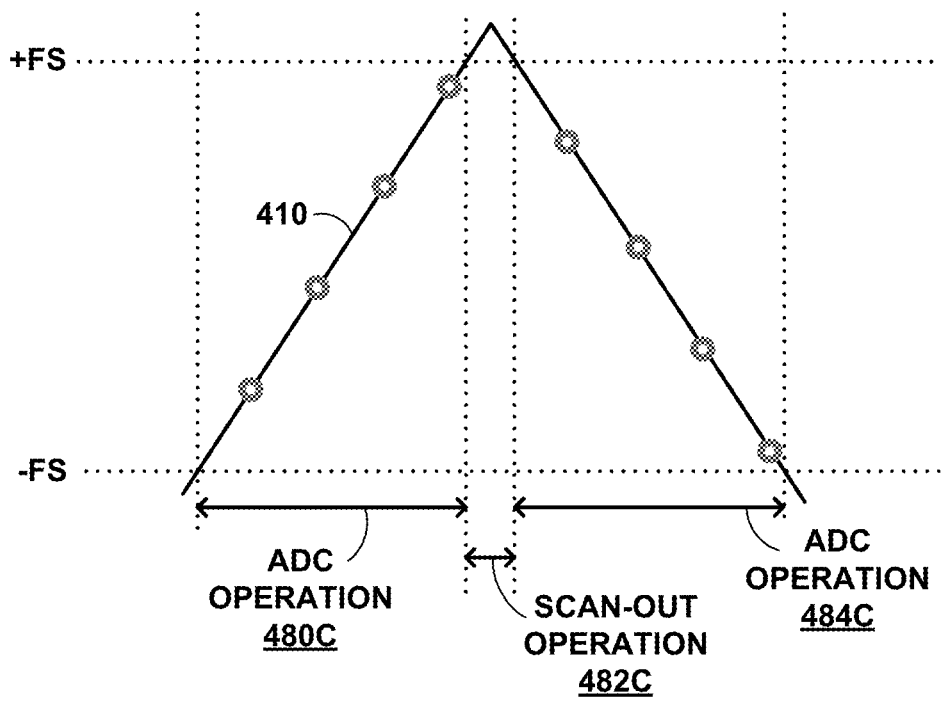

FIGS. 4B and 4C are graphs of odd and even codes for two tests of a test signal 410 using an interleaved design. FIGS. 4B and 4C show sampling of test signal 410 using a two-way interleaved design, where the sampling occurs for every other instance of sampling clock 422. In the example of a four-way interleaved design, the sampling could occur for every fourth instance of sampling clock 422. In the example of FIGS. 4B and 4C, the frequency of sampling clock 422 may be sixteen times greater than the frequency of test signal 410. Thus, ADC 420 produces sixteen instances of digital code 430.

During ADC operation 480B, decoder 440 may cause first counter, third counter, fifth counter, and seventh counter of counters 442A-442N to increment. During ADC operation 484B, decoder 440 may cause an eighth counter, sixth counter, fourth counter, and second counter of counters 442A-442N to increment. Scan-out block 444 can output the counts during scan-out operation 482B and/or after ADC operation 484B. During ADC operation 480C, decoder 440 may cause second counter, fourth counter, sixth counter, and eighth counter of counters 442A-442N to increment. During ADC operation 484C, decoder 440 may cause a seventh counter, fifth counter, third counter, and first counter of counters 442A-442N to increment.

The codes sampled by decoder 440 during ADC operations 480B and 484B may be different than the codes sampled by decoder 440 during ADC operations 480C and 484C. Thus, the number of counters 442A-442N for two-way interleaving may be one-half the number of counters 342A-342N for sixteen instances of digital code 430 (e.g., four-bit resolution). However, the testing time for two-way interleaving may be twice the time without any interleaving (e.g., measurement circuit 300).

Figure 5:
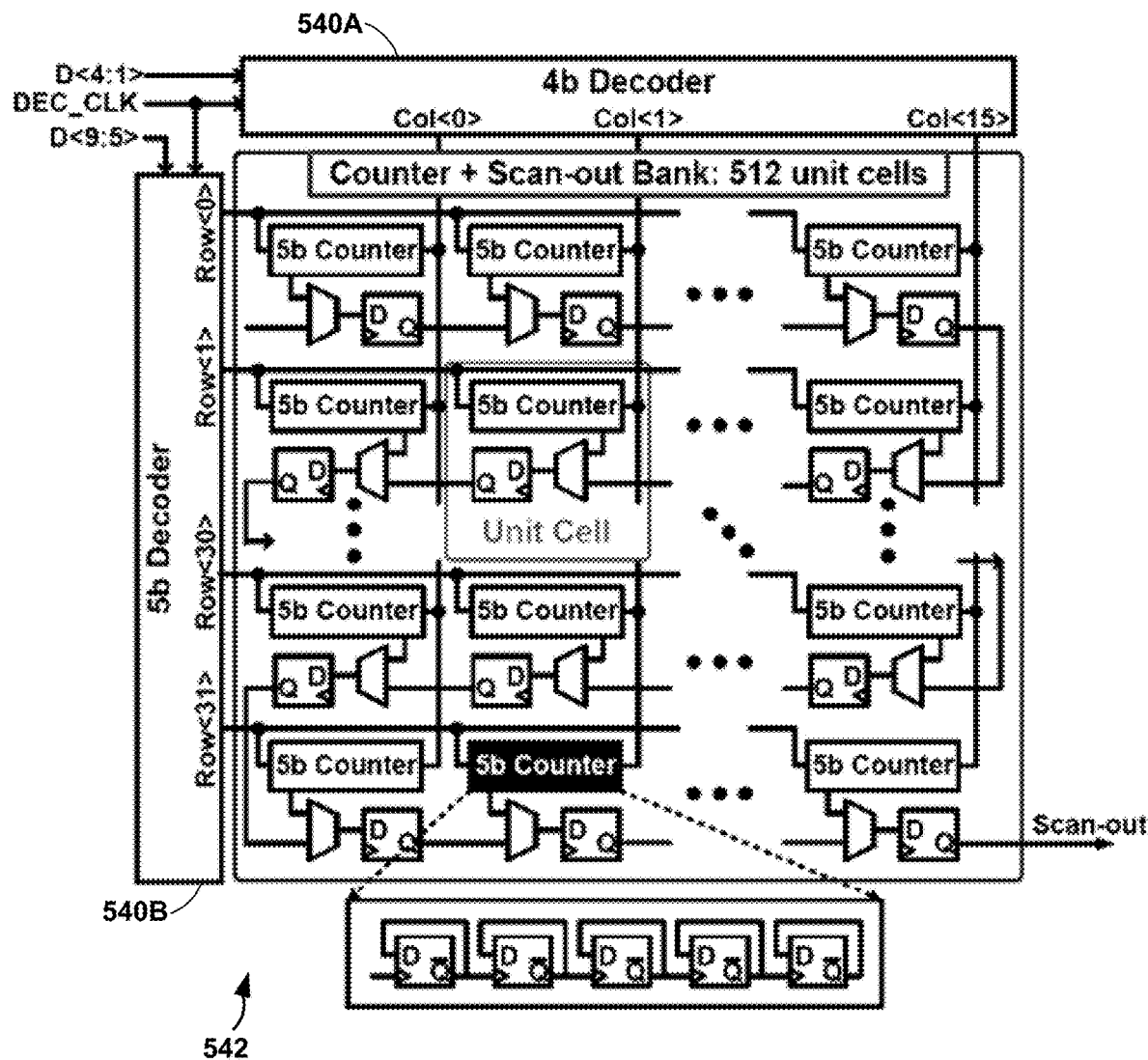
FIG. 5 is a block diagram showing an array of five-bit counters, a row decoder, and a column decoder.

FIG. 5 is a block diagram showing an array of five-bit counters 542, a row decoder, and a column decoder 540B. Array of counters 542 may include a total of 512 five-bit counters 542 for a ten-bit ADC and two-way interleaving. The column and row decoders 540A and 540B may be configured to decode the ten-bit code from the ADC, less the one LSB for even/odd code selection. Four-bit column decoder 540A and five-bit row decoder 540B select and increment the five-bit counter corresponding to ADC code D<9:1>. In the example shown in FIG. 5, array of five-bit counters 542 can store count values up to thirty-two, which scan-out block 544 can read out between signal ramps (e.g., ADC operations 480B, 484B, 480C, and 484C).

In some examples, array of counters 542 includes a different number of counters. For a ten-bit ADC and four-way interleaving, array of counter 542 may include 256 counters. Array of counters 542 can include a one-dimensional array with a single decoder, a two-dimensional array with two decoders as shown in FIG. 5, or a three-dimensional array with three decoders.

FIGS. 6A-6C are graphs of the non-linearity for a measurement circuit including counters (see, e.g., measurement circuit 300 shown in FIG. 3B). FIGS. 6D-6F are graphs of the non-linearity for a measurement circuit without counters or on-chip memory (see, e.g., measurement circuit 100 shown in FIG. 1B). The vertical axes of the graphs shown in FIGS. 6A-6F represent the DNL for the LSB of the digital codes outputted by an ADC. The horizontal axes of the graphs shown in FIGS. 6A-6F represent the digital codes outputted by an ADC. In the example graphs shown in FIGS. 6A-6F, the measurement circuit including counters exhibits much lower non-linearity than the measurement circuit without counters or an on-chip memory bank.

The ten-bit SAR-ADC described herein (e.g., ADCs 120, 220, 320, and 420) can be fabricated in a 65-nm complementary metal-oxide-semiconductor (CMOS) technology. The results shown in FIGS. 6A-6F are for three different clock frequencies: 0.1 MHz, 1.0 MHz, and 10 MHz. A core VDD of 1.2 volts, an IO VDD of two volts, and an input ramp range of 0.8 volts were used for the experiment. An IO voltage of two volts is slightly lower than the nominal level to further reduce IO switching noise.

Figure 7:
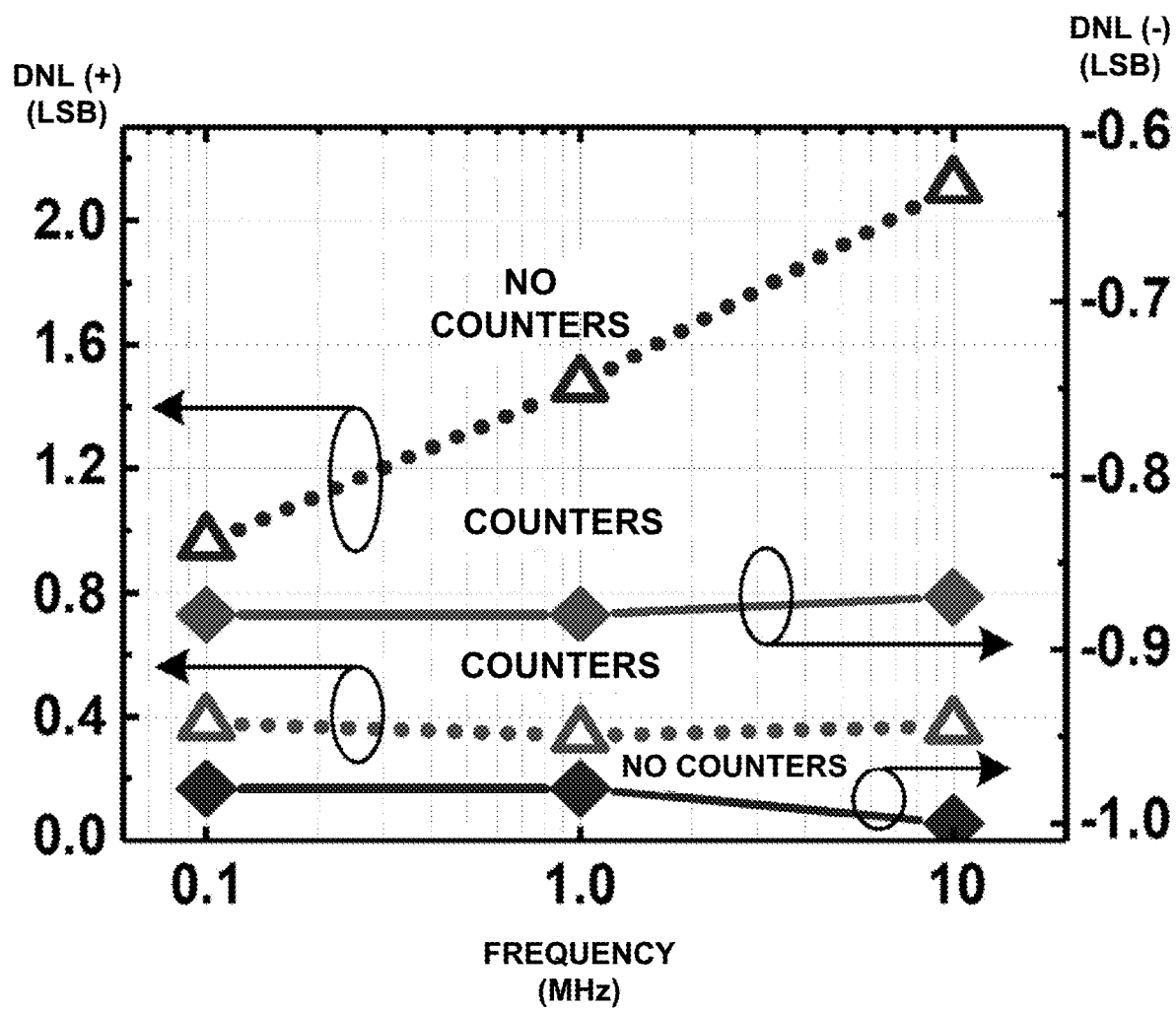
FIG. 7 is a graph of non-linearity and frequency for measurement circuits with and without counters.

FIG. 7 is a graph of non-linearity and frequency for measurement circuits with and without counters. As the frequency increases, DNL in the measurement circuit without counters or on-chip memory (e.g., measurement circuit 100 shown in FIG. 1B) gets progressively worse, while the DNL in the measurement circuit including counters (e.g., measurement circuit 300 shown in FIG. 3B) is not affected. The DNL for the measurement circuit including counters ranges from −0.88 LSB to +0.34 LSB while for the measurement circuit without counters or on-chip memory, the DNL ranges from −1.00 LSB to +2.11 LSB. The higher immunity to noise means that a measurement circuit including counters can measure ADC performance more precisely without an elaborate board design or test setup.

Figure 8A:
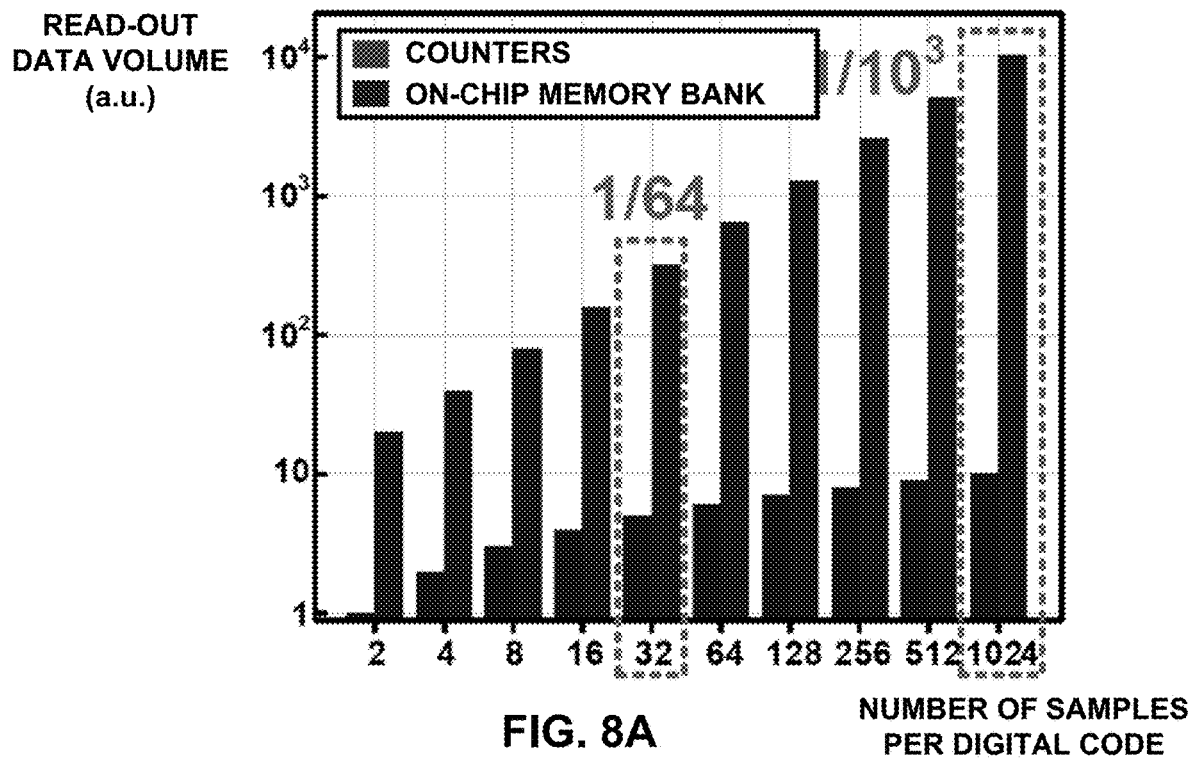
FIG. 8A is a graph comparing the data volume for measurement circuits with counters and on-chip memory.

FIG. 8A is a graph comparing the data volume for measurement circuits with counters and on-chip memory. FIG. 8A compares the read out data volume of a measurement circuit including counters and a measurement circuit including an on-chip memory bank. For an N-bit ADC, the data volume of the two measurement circuits can be expressed as $2^N \times \log_2(\text{\# of samples/code})$ and $2^N \times N \times \log_2(\text{\# of samples/code})$, respectively. The measurement circuit employing five-bit counters reduces the data volume by a factor of sixty-four.

Figure 8B:
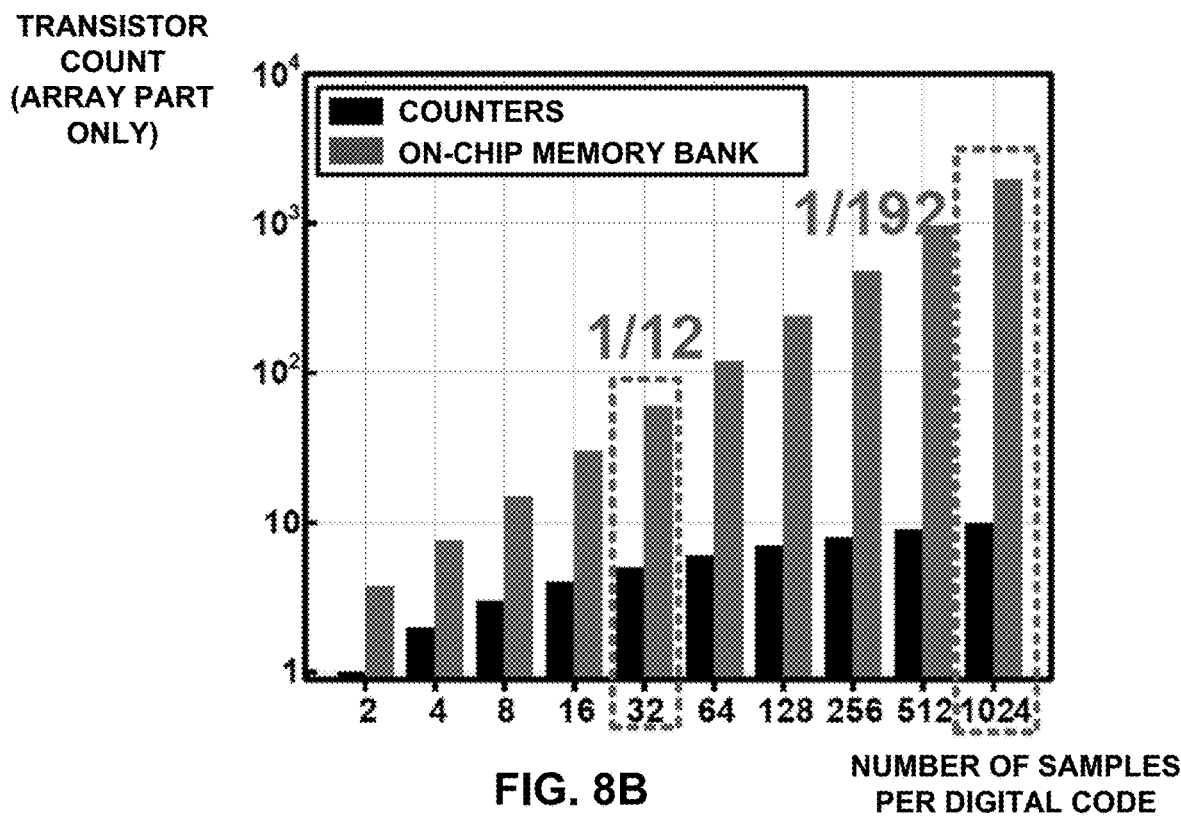
FIG. 8B is a graph comparing the transistor count for measurement circuits with counters and on-chip memory.

FIG. 8B is a graph comparing the transistor count for measurement circuits with counters and on-chip memory. FIG. 8B shows the transistor count comparison (array part only) for a measurement circuit including counters and a measurement circuit including an on-chip memory bank. The measurement circuit including counters has an asynchronous counter based on a chain of D-flip-flop (DFF) circuits. Each DFF has a transistor count of thirty-two. A single SRAM cell has a transistor count of six. Based on these assumptions, the measurement circuit including counters achieves a 12× reduction in transistor count, as compared to the measurement circuit including on-chip memory.

Figure 9A:
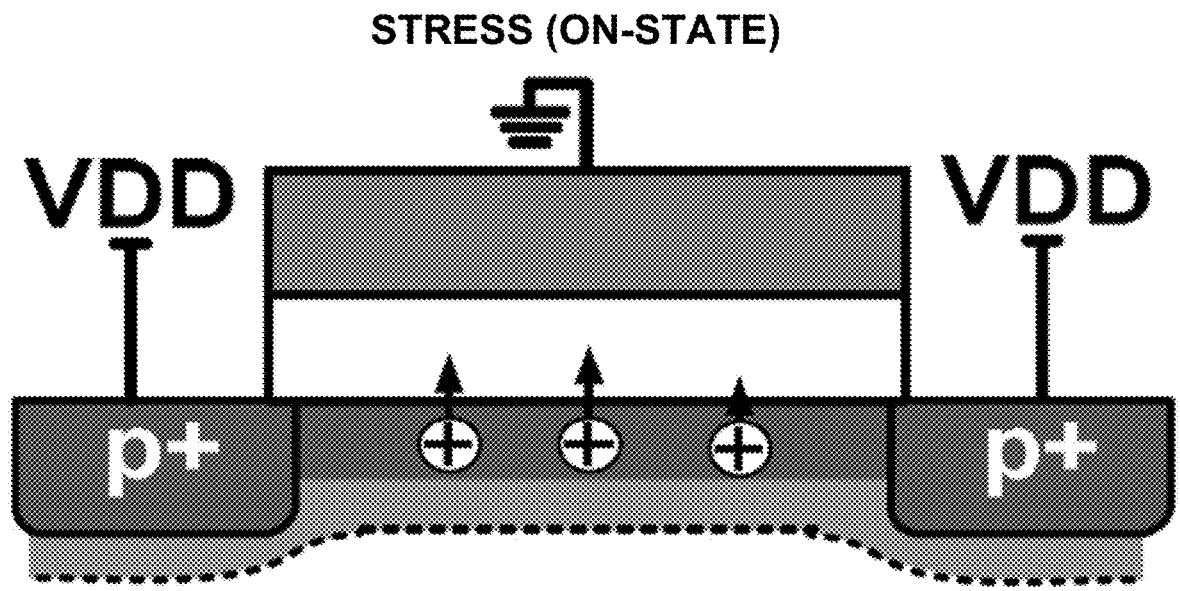
FIGS. 9A and 9B are diagrams showing threshold voltage degradation and recovery due to short-term BTI effects.
Figure 9B:
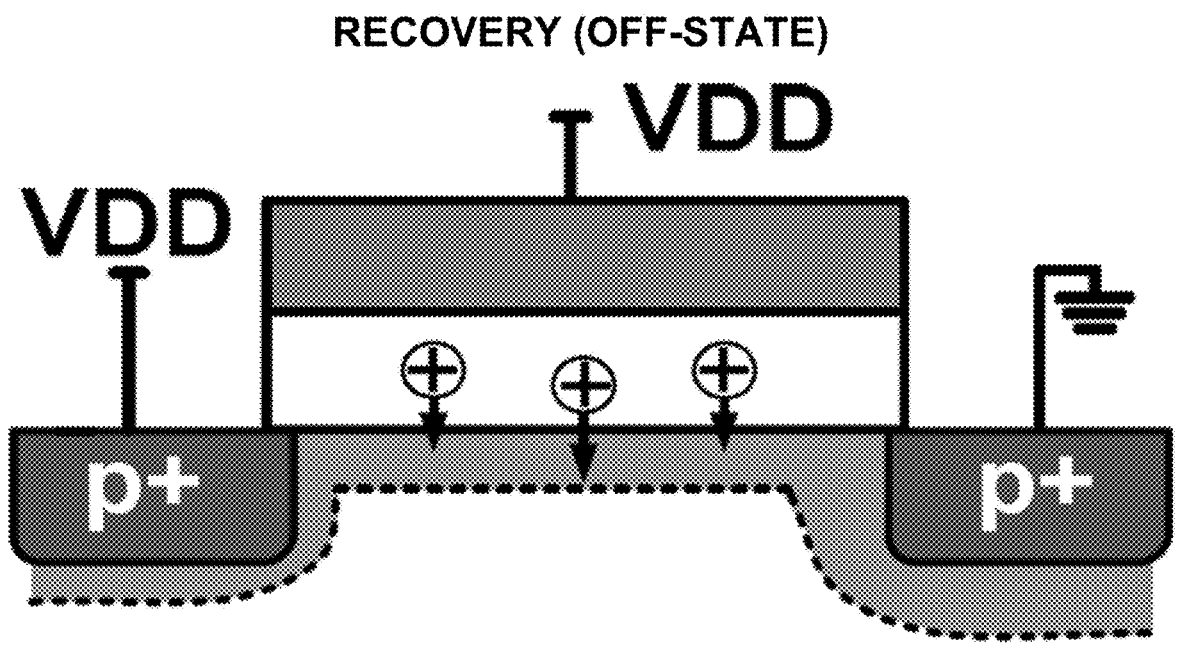

FIGS. 9A and 9B are diagrams showing threshold voltage degradation and recovery due to short-term BTI effects. Bias temperature instability (BTI) has become a critical reliability concern in advanced technologies. BTI degradation occurs when carriers get trapped in the interface or the gate dielectric while the device is in a strong inversion mode. This degradation causes the threshold voltage (Vth) to increase. The magnitude of the Vth shift is a function of temperature, voltage, and stress time. When the stress voltage is removed, the device immediately enters a "recovery" phase. BTI degradation and recovery can occur even at microsecond time scales affecting noise-sensitive circuits such as comparators. For instance, when two input transistors of a comparator circuit are exposed to two very different input voltages, asymmetric short-term BTI aging can lead to a time-dependent offset voltage.

Figure 10A:
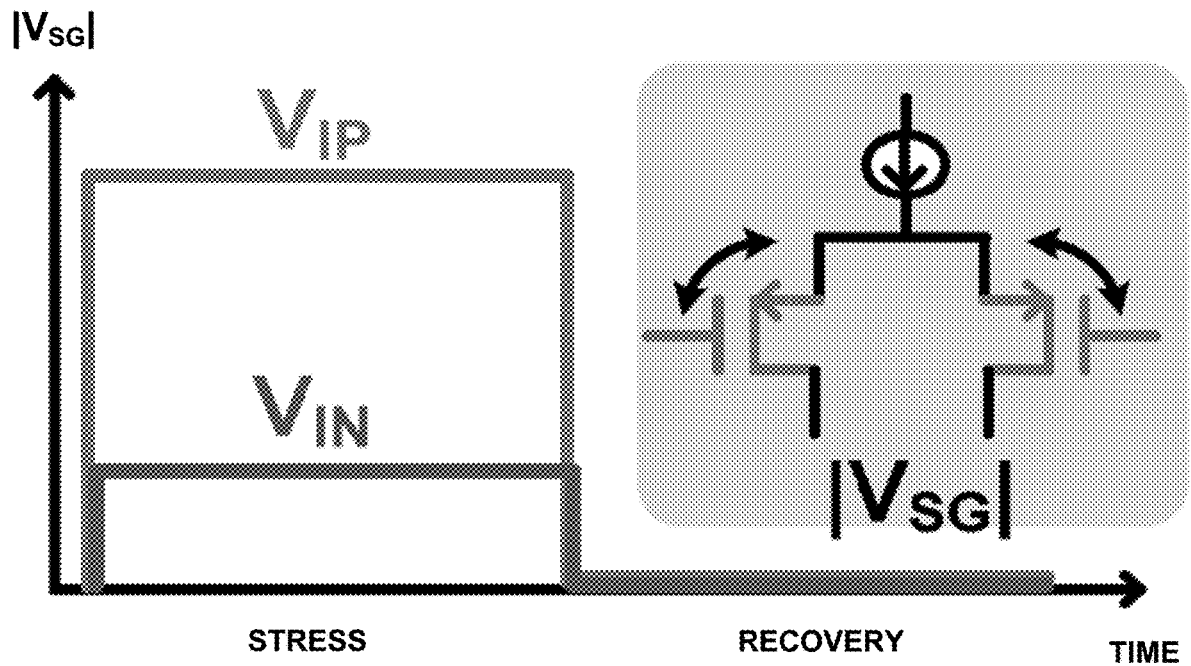
FIGS. 10A and 10B are graphs showing the variation of the input offset voltage of a comparator circuit based on the difference between the two input voltages.
Figure 10B:
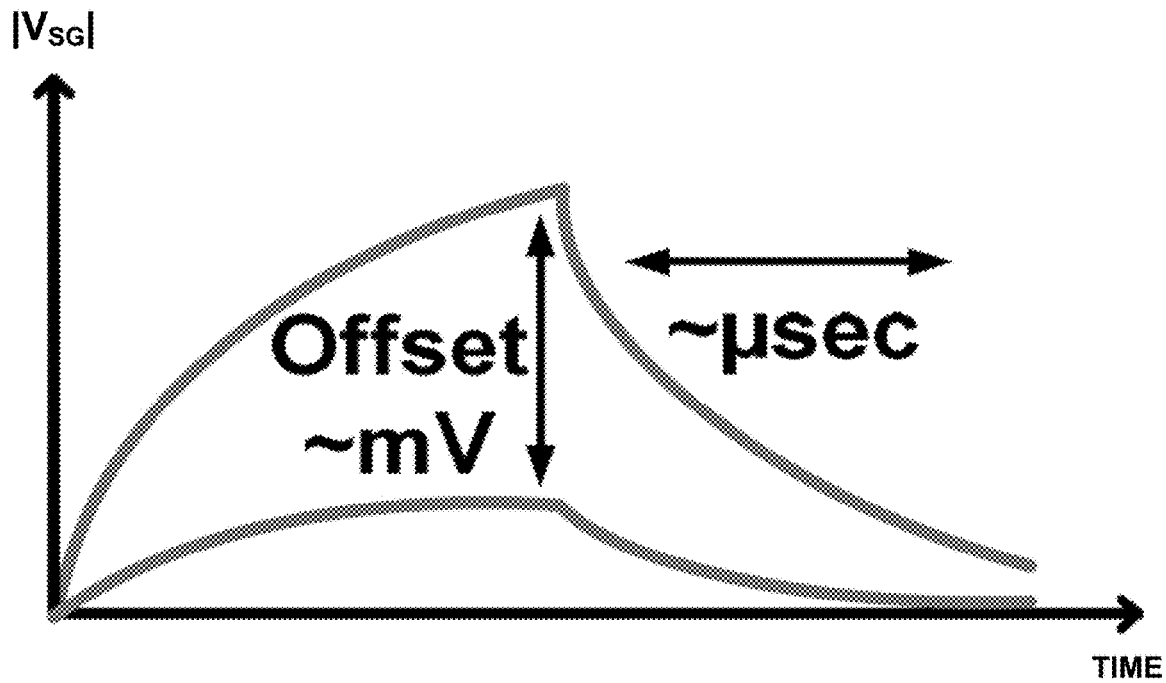

FIGS. 10A and 10B are graphs showing the variation of the input offset voltage of a comparator circuit based on the difference between the two input voltages. More specifically, a large asymmetric voltage stress in the input transistors in early conversion steps can induce an error in the later steps where a small voltage difference must be resolved by the comparator, as shown in FIGS. 11 and 12. This issue can be detrimental to the performance of SAR-ADCs even for a fresh chip.

Figure 11A:
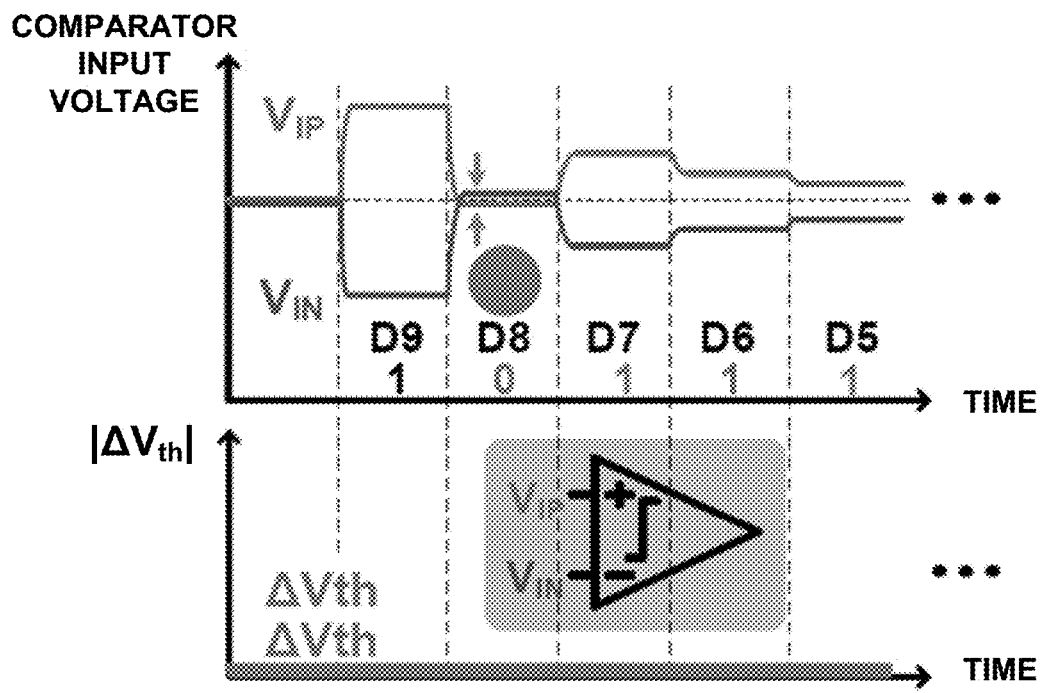
FIGS. 11A and 11B are graphs showing how short-term bias temperature instability (BTI) can cause an error in the conversion process for a ten-bit successive approximation register analog-to-digital converter (SAR-ADC).
Figure 11B:
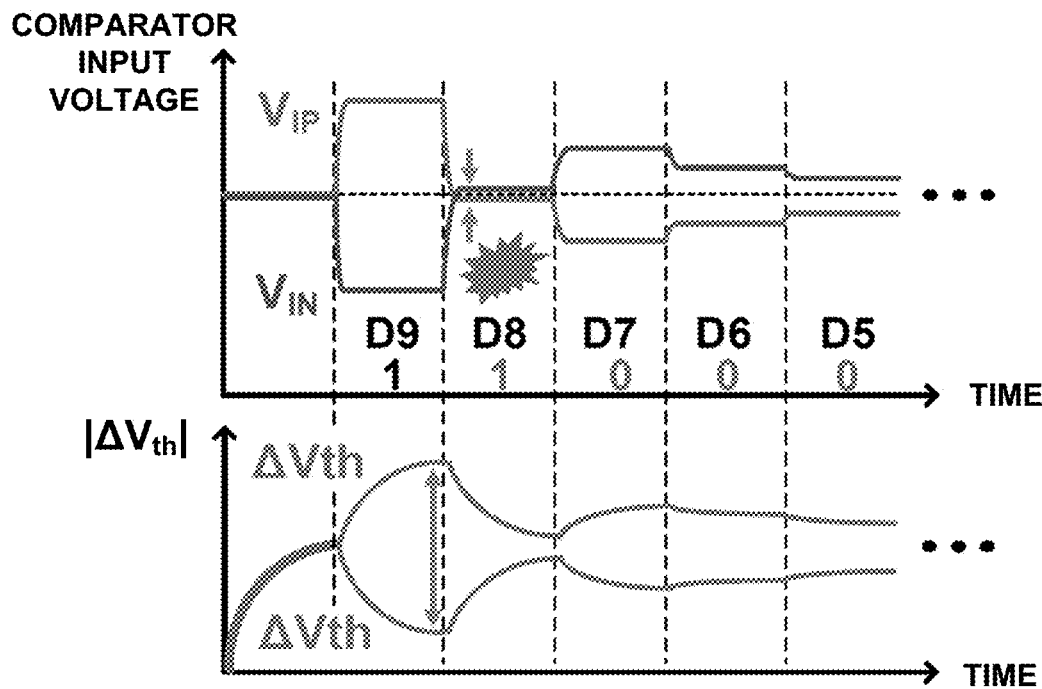

FIGS. 11A and 11B are graphs showing how short-term bias temperature instability (BTI) can cause an error in the conversion process for a ten-bit successive approximation register analog-to-digital converter (SAR-ADC). FIG. 12 is a table showing the digital codes that are most vulnerable to short-term BTI effects in a ten-bit SAR-ADC. Certain digital codes are more vulnerable to short-term instability effects, as shown in FIG. 12. One of the vulnerable codes is $D=767_{10}$ which ends with a binary pattern of 0111 . . . . In the absence of short-term instability, the correct output code is produced. However, when short-term instability is present, an incorrect code of $D=768_{10}$ can be generated, which ends with 1000 . . . . The error in this example is caused in the third conversion step. Other vulnerable codes listed in FIG. 12 have similar patterns: a zero followed by one or a one followed by zeroes.

The short-term BTI effects were measured in a ten-bit SAR-ADC by measuring the DNL of vulnerable codes using a measurement circuit including counters. The typical value of voltage offset caused by short-term BTI can be less than a millivolt, which is difficult to measure.

Figure 13:
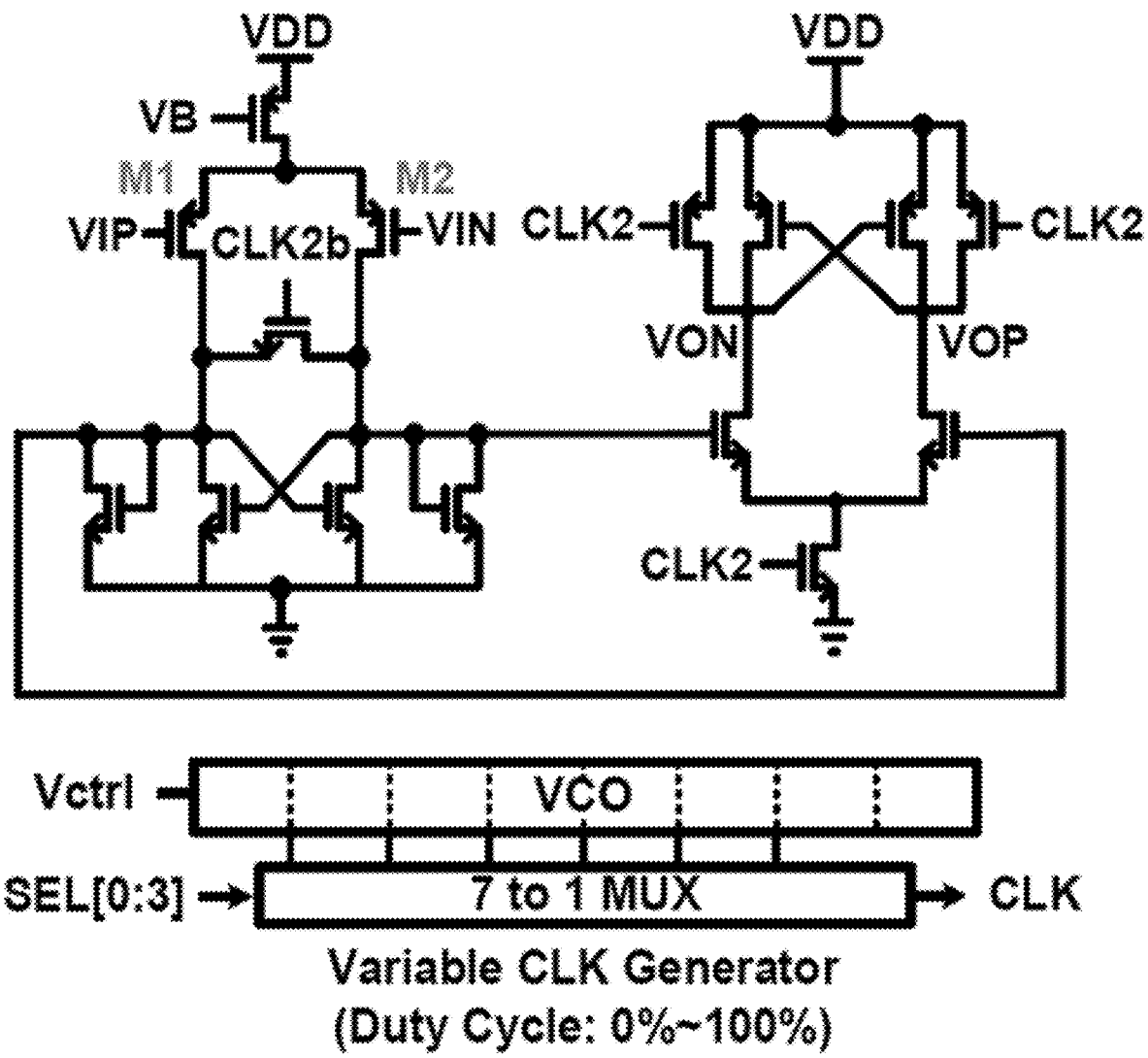
FIG. 13 is a circuit diagram of an input comparator and a variable duty cycle clock generator.
Figure 14:
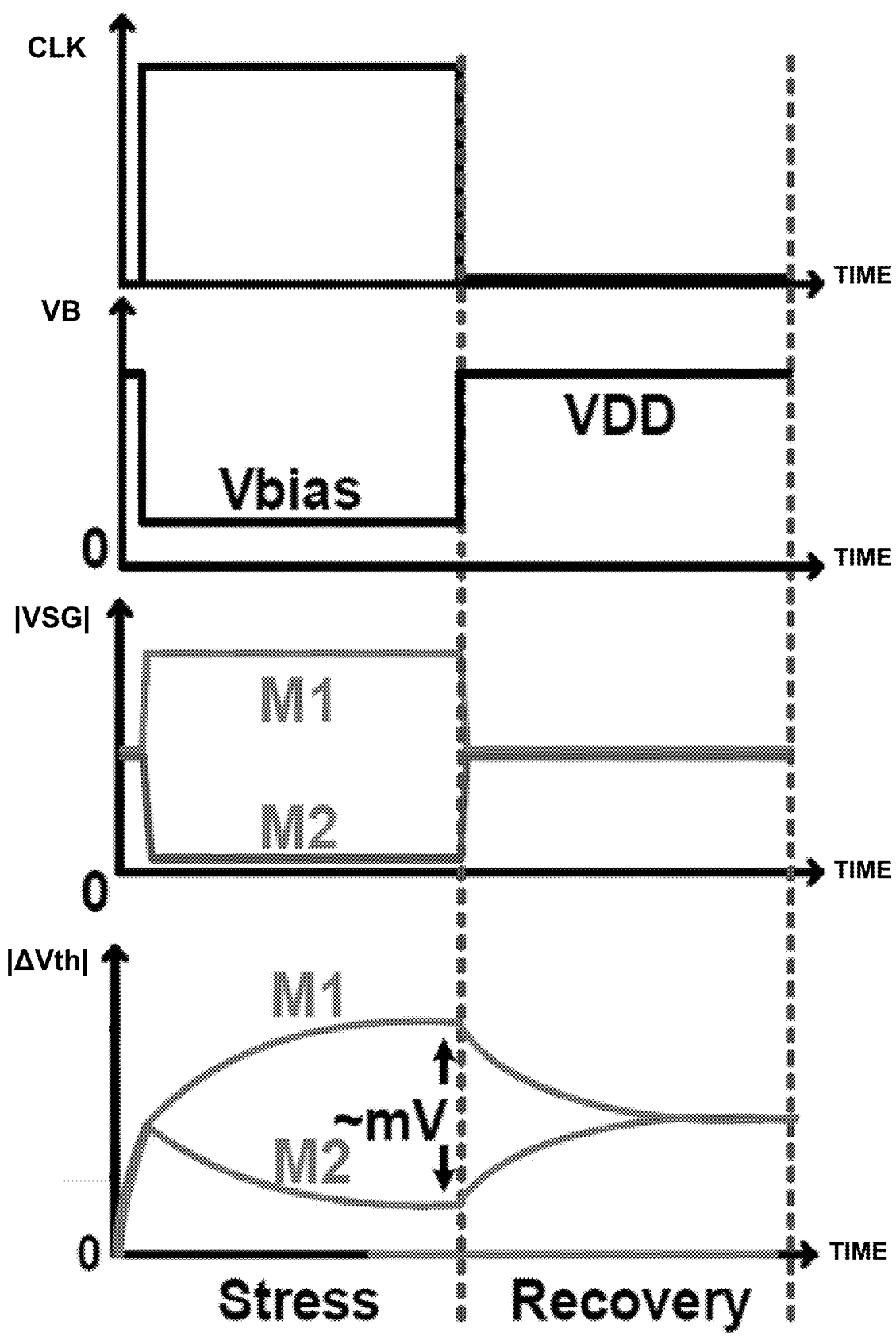
FIG. 14 shows graphs of a clocked bias current for studying fast BTI degradation and recovery effects in comparator circuits.

FIG. 13 is a circuit diagram of an input comparator and a variable duty cycle clock generator. FIG. 14 shows graphs of a clocked bias current for studying fast BTI degradation and recovery effects in comparator circuits. The ratio between the stress and recovery times is varied by switching on and off the header p-type MOS (PMOS) device of the comparator. The comparator shown in FIG. 13 includes a preamp stage to reduce kickback noise and input-referred noise. The comparator is implemented using IO devices to suppress gate leakage and sub-threshold leakage. Either PMOS input comparators or n-type MOS (NMOS) input comparators are possibilities.

A multi-phase voltage controlled oscillator (VCO) and a phase selection MUX can generate the variable duty cycle clock. For the PMOS input comparator shown in FIG. 13, switching off the header causes the common source node of the input PMOS transistors to collapse, forcing the two input devices into a recovery state. The source-gate voltages (|Vsg|) of the two input transistors equalize and consequently, the asymmetric Vth degradation is recovered prior to the next conversion step. A shorter duty cycle clock can reduce the BTI-induced Vth shift further by virtue of a short stress time and a long recovery time. The clock frequency also has an impact on the short-term BTI effect in a SAR-ADC.

Figure 15A:
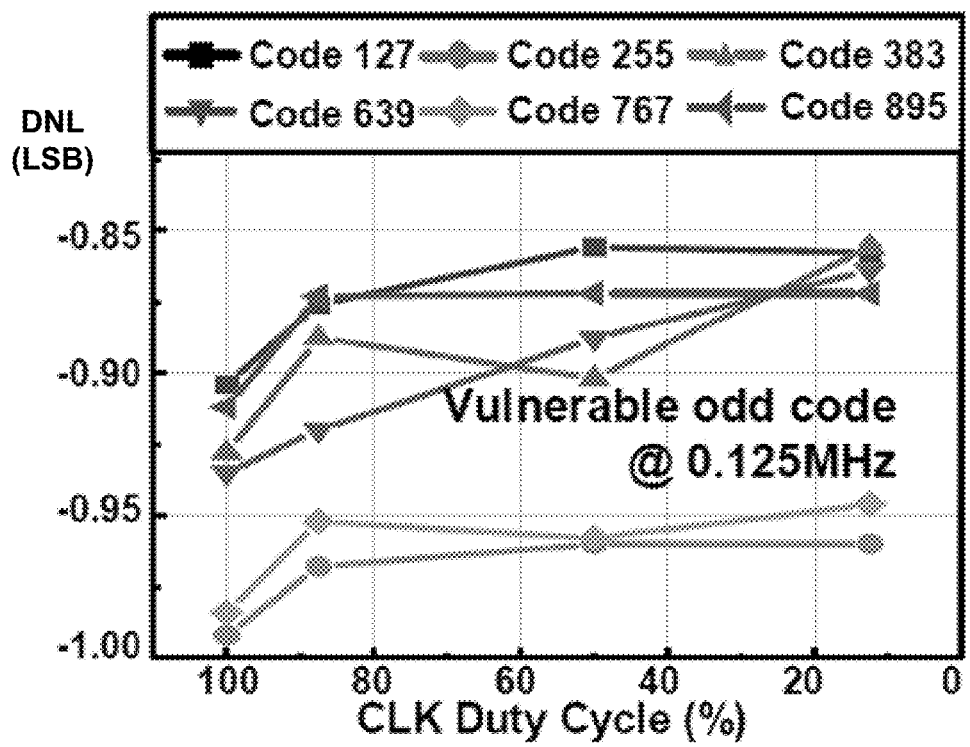
FIGS. 15A and 15B are graphs showing the DNL measured under different duty cycles for the most vulnerable codes.
Figure 15B:
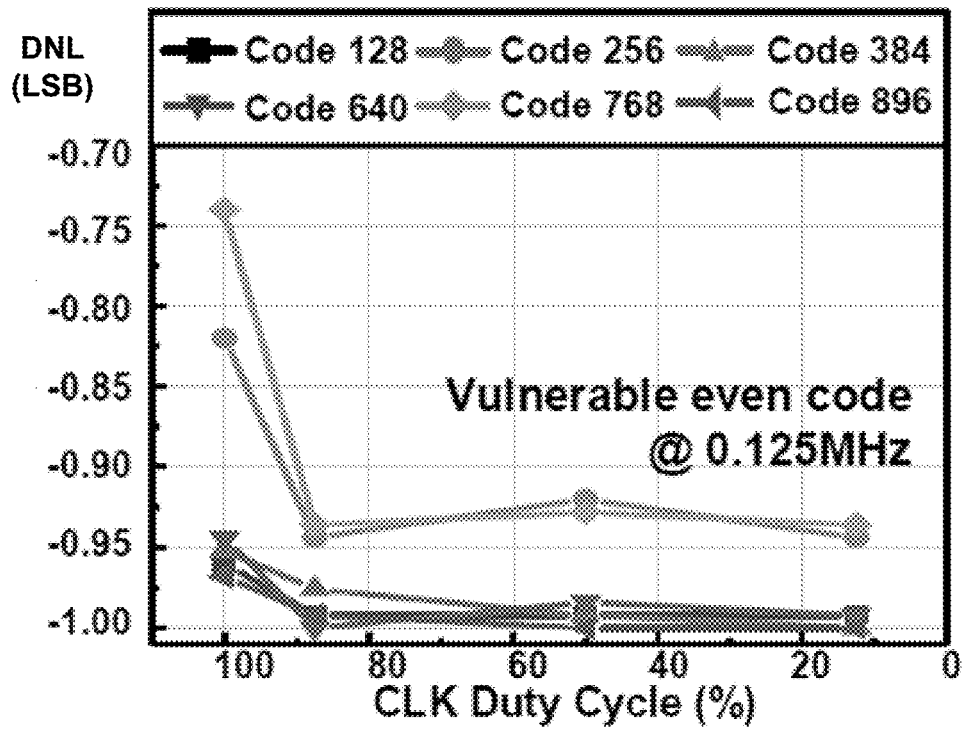
Figure 16A:
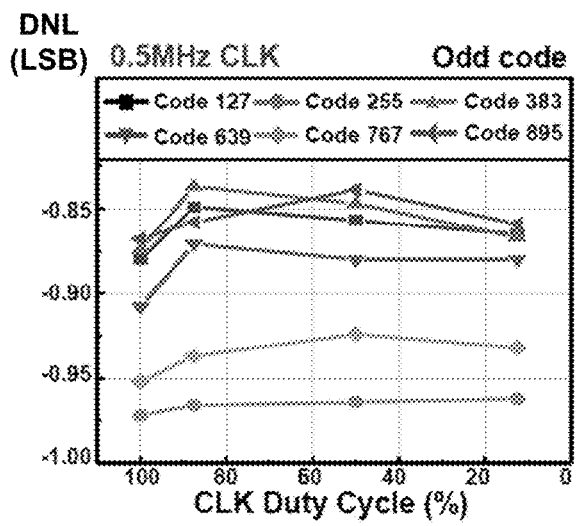
FIGS. 16A-16D are graphs showing the DNL measured at clock frequencies of five hundred kilohertz and two megahertz for the most vulnerable odd and even codes.
Figure 16B:
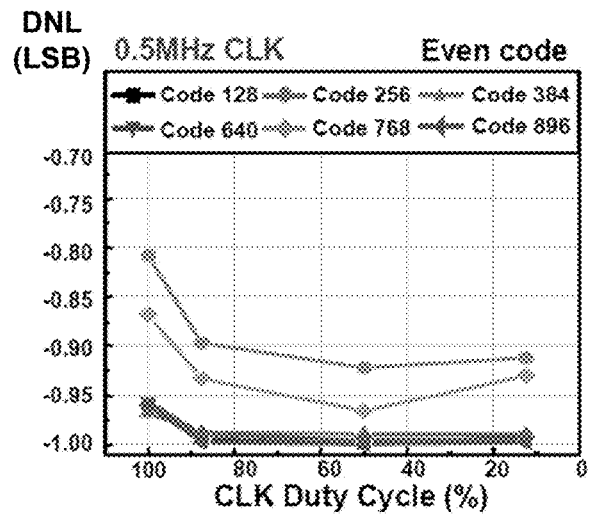
Figure 16C:
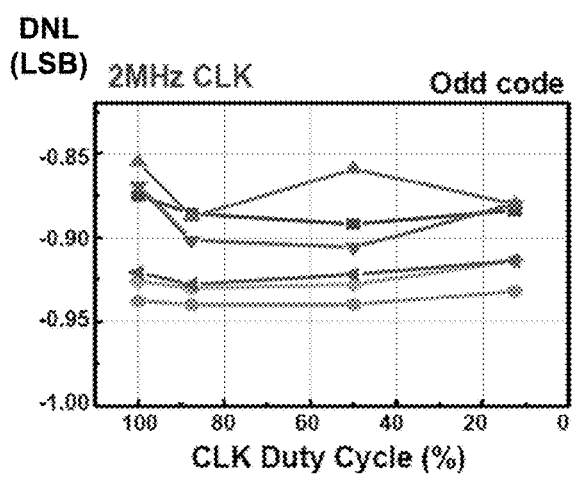
Figure 16D:
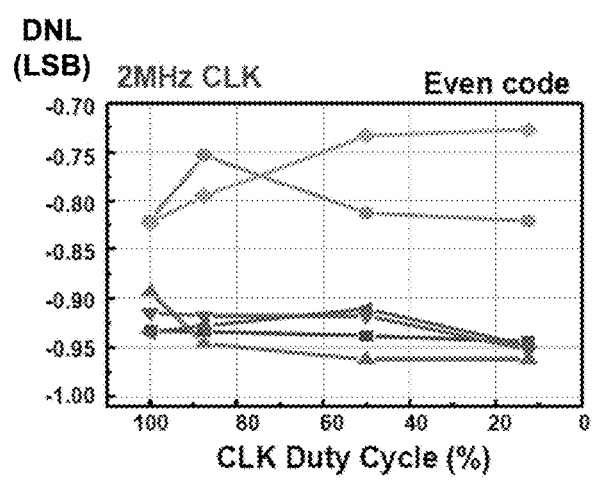

FIGS. 15A and 15B are graphs showing the DNL measured under different duty cycles for the most vulnerable codes. The graph in FIG. 15A shows the DNL of the vulnerable odd codes ending in 0111 (i.e. D=127, 255, 383, 639, 767, 895) for different duty cycles. The graph in FIG. 15B shows the DNL of the vulnerable even codes ending in 1000 (i.e. D=128, 256, 384, 640, 768, 896) for different duty cycles. A relatively slow clock frequency of 0.125 MHz was used in this test to cause more BTI degradation. Results show that for shorter duty cycles, DNL tends to increase for the odd codes and decrease for the even codes. The number of occurrences of vulnerable odd codes increases while that of vulnerable even codes decreases. This trend suggests that some of the incorrect codes are rectified by the longer recovery time.

FIGS. 16A-16D are graphs showing the DNL measured at clock frequencies of five hundred kilohertz and two megahertz for the most vulnerable odd and even codes. As shown in FIGS. 16A-16D, the DNL trend lines are generally flat. Short-term instability is less obvious at higher frequencies due to the shorter stress time.

Figures 17A, 17B:
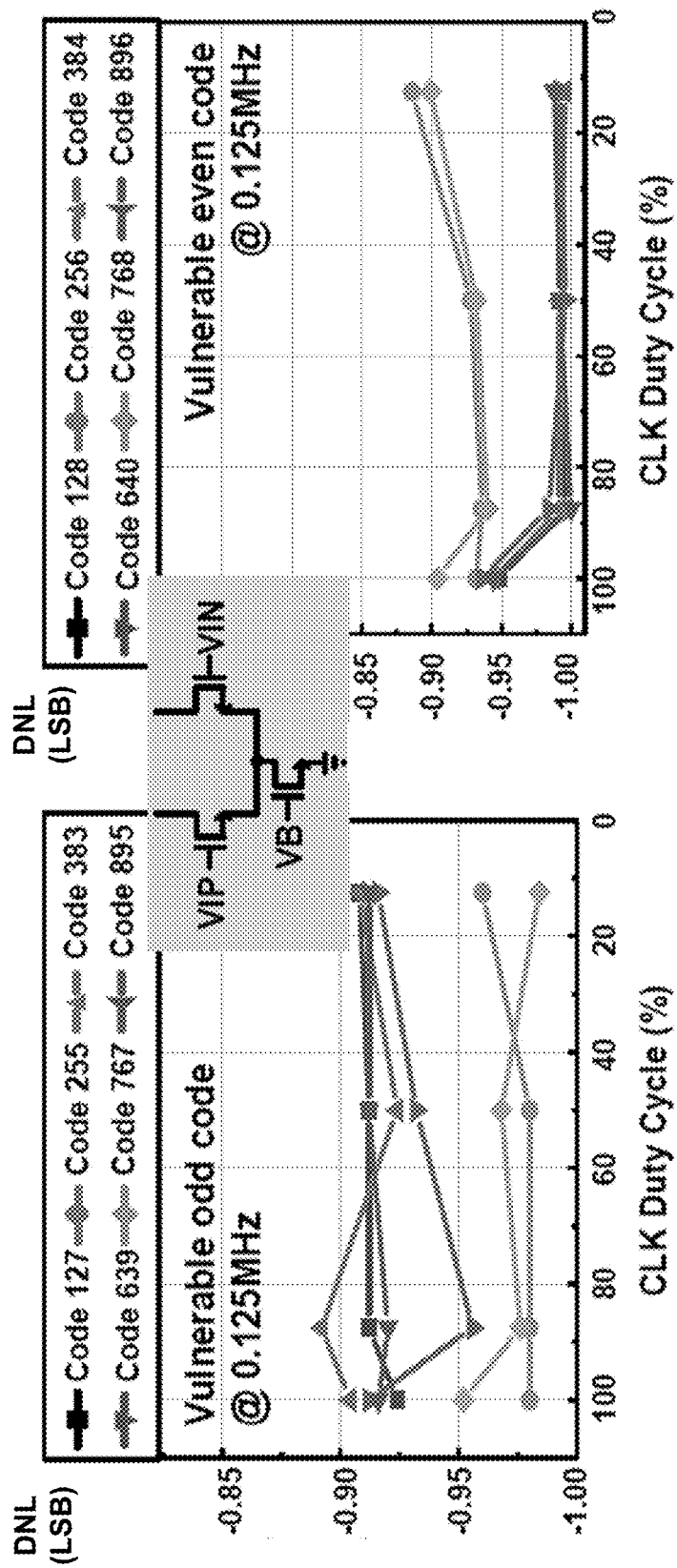
FIGS. 17A and 17B are graphs showing the DNL for SAR-ADC with IO NMOS input comparators suggesting negligible short-term instability effects.

FIGS. 17A and 17B are graphs showing the DNL for SAR-ADC with IO NMOS input comparators suggesting negligible short-term instability effects. There is no apparent shift in the DNL value to indicate that short-term instability is less pronounced for NMOS devices in this technology. Thus, one remedy for short-term instability issues in this technology is to use comparators with NMOS input devices.

Figures 18, 19:
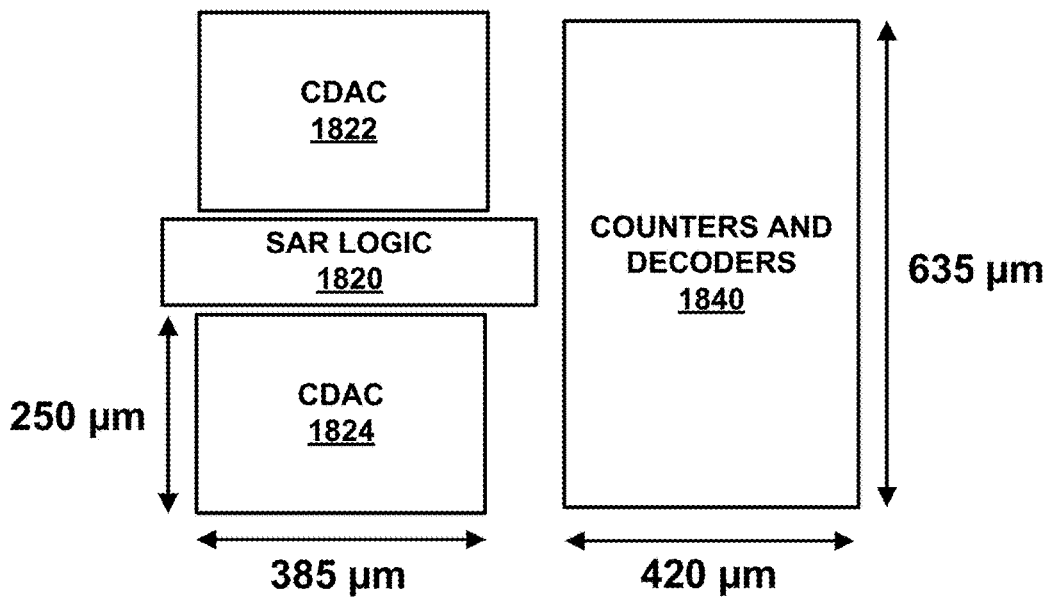
FIG. 18 is a block diagram showing an example layout of a measurement circuit including counters.
FIG. 19 is a table including the chip features.

FIG. 18 is a block diagram showing an example layout of a measurement circuit including counters. FIG. 19 is a table including the chip features. FIG. 18 shows that counters and decoders 1840 is approximately the same size as the SAR-ADC, which includes SAR logic 1820 and capacitance digital-to-analog converters (CDACs) 1822 and 1824.

Figure 20:
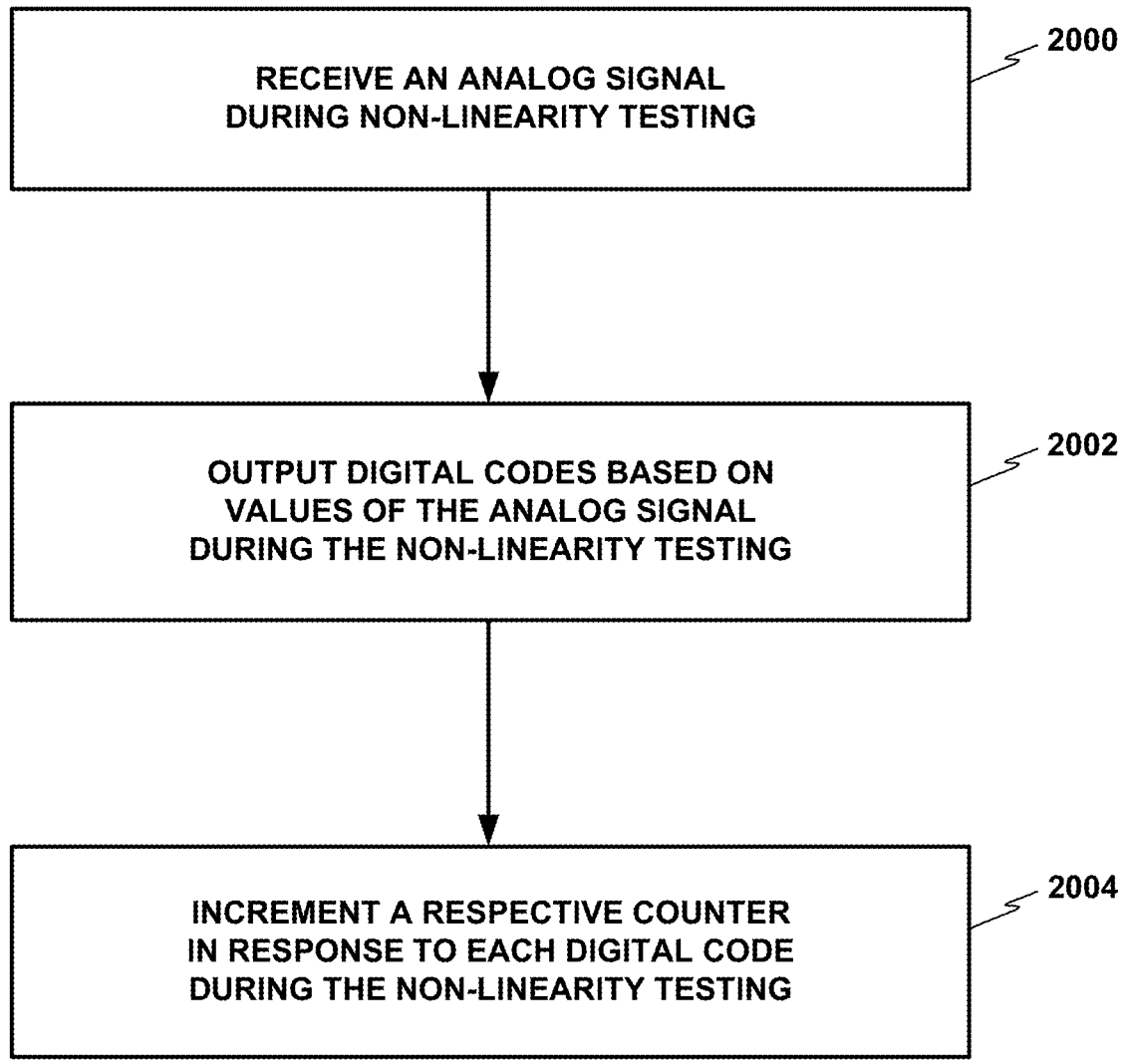
FIG. 20 is a flow diagram illustrating example techniques for testing the non-linearity of an ADC.

FIG. 20 is a flow diagram illustrating example techniques for testing the non-linearity of an ADC. The example techniques of FIG. 20 are described with respect to measurement circuit 300 shown in FIG. 3B, although other components and devices such as measurement circuit 400 shown in FIG. 4A may perform similar techniques.

In the example of FIG. 20, ADC 320 receives test signal 310 during non-linearity testing (2000). Test signal 310 may be a triangular waveform with a frequency that is low enough that ADC 320 will output multiple instances of each value of digital code 330 during single-pass non-linearity testing. ADC 320 then outputs digital codes 330 based on values of test signal 310 during the non-linearity testing (2002). ADC 320 may convert test signal 310 to digital code 330 based on sampling clock 322.

In the example of FIG. 20, decoder 340 increments a respective one of counters 342A-342N in response to each digital code 330 outputted by ADC 320 during the non-linearity testing (2004). Decoder 340 receives digital code 330 and activates the corresponding one of counters 342A-342N based on the value of digital code 330. For example, decoder 340 may activate a first counter in response to receiving digital code 330 with a first value. Decoder 340 may activate a second counter in response to receiving digital code 330 with a second value. The activated counter can increment in response to being activated by decoder 340 and in response to sampling clock 322.

Various examples have been described. These and other examples are within the scope of the following claims.

The invention claimed is:

1. A device comprising:
an analog-to-digital converter (ADC) configured to receive an analog signal and output digital codes based on values of the analog signal;
a plurality of counters, wherein each counter of the plurality of counters is configured to increment in response to a respective digital code outputted by the ADC; and
an interleaving controller configured to:
determine that a particular bit of a first digital code outputted by the ADC matches a control bit; and
cause a respective counter of the plurality of counters to increment in response to determining that the particular bit of the first digital code matches the control bit.

2. The device of claim 1, wherein the plurality of counters are configured to store results of non-linearity testing of the ADC.

3. The device of claim 1, further comprising a decoder, wherein the interleaving controller is configured to send an enable signal to the decoder in response to determining that the particular bit matches the control bit, and
wherein the decoder is configured to:
receive at least a portion of the first digital code outputted by the ADC; and
cause the respective counter of the plurality of counters to increment in response to receiving at least the portion of the first digital code and in response to receiving the enable signal from the interleaving controller.

4. The device of claim 1, wherein a position of the particular bit in the first digital code is a least significant bit position in the first digital code.

5. The device of claim 1, wherein the interleaving controller is configured to cause the respective counter to increment by delivering an enable signal to a decoder.

6. The device of claim 1,
wherein the respective counter comprises a first counter, and
wherein the interleaving controller is configured to:
determine that a particular bit of a second digital code outputted by the ADC does not match the control bit; and
suppress a second counter of the plurality of counters from incrementing in response to determining that the particular bit of the second digital code does not match the control bit.

7. The device of claim 6, wherein the interleaving controller is configured to suppress the second counter from incrementing by delivering a disable signal to a decoder.

8. The device of claim 1, wherein the ADC and the plurality of counters are integrated into a single semiconductor chip.

9. The device of claim 1, further comprising a scan-out circuit configured to output counts stored by the plurality of counters during a pause in the non-linearity testing.

10. The device of claim 1, wherein the plurality of counters is arranged in rows and columns, the device further comprising:
a row decoder configured to:
receive a first portion of the first digital code outputted by the ADC;
enable a row of the plurality of counters in response to receiving the first portion of the first digital code; and
a column decoder configured to:
receive a second portion of the first digital code outputted by the ADC, the second portion being different than the first portion; and
enable a column of the plurality of counters in response to receiving the second portion of the first digital code.

11. The device of claim 1,
wherein the respective counter is a first counter,
wherein the particular bit is a first least significant bit, and
wherein the interleaving controller is configured to:
determine whether the first least significant bit of a second digital code outputted by the ADC matches a first control bit;
determine whether a second least significant bit of the second digital code outputted by the ADC matches a second control bit; and
suppress a second counter of the plurality of counters from incrementing in response to:
determining that the first least significant bit does not match the first control bit; and
determining that the second least significant bit does not match the second control bit.

12. A method comprising:
receiving, at an analog-to-digital converter (ADC), an analog signal during non-linearity testing;

outputting, by the ADC, digital codes based on values of the analog signal during the non-linearity testing;

determining, by an interleaving controller, that a particular bit of a first digital code outputted by the ADC matches a control bit;

causing, by the interleaving controller, a respective counter of a plurality of counters to increment in response to determining that the particular bit of the first digital code matches the control bit; and incrementing the respective counter in response to determining that the particular bit the first digital code matches the control bit.

13. The method of claim 12, wherein the respective counter is a first counter, and wherein the particular bit is a first least significant bit, the method further comprising:

determining that the least significant bit of a first digital code outputted by the ADC matches the control bit;

causing the first counter of the plurality of counters to increment in response to determining that the least significant bit of the first digital code matches the control bit;

determining that a least significant bit of a second digital code outputted by the ADC does not match the control bit; and suppressing a second counter of the plurality of counters from incrementing in response to determining that the least significant bit of the second digital code does not match the control bit.

14. The method of claim 12, further comprising outputting counts stored by the plurality of counters during a pause in the non-linearity testing.

15. A device comprising:

a plurality of counters, wherein each counter of the plurality of counters is configured to increment in response to a respective digital code outputted by an analog-to-digital converter (ADC) during non-linearity testing; and a scan-out circuit configured to output counts stored by the plurality of counters during a pause in the non-linearity testing.

16. The device of claim 15, further comprising a decoder configured to:

receive a digital code outputted by the ADC; and cause a respective counter of the plurality of counters to increment in response to receiving the digital code.

17. The device of claim 15, further comprising an interleaving controller configured to:

determine that a particular bit of a first digital code outputted by the ADC matches a control bit;

cause a respective counter of the plurality of counters to increment in response to determining that the particular least significant bit of the first digital code matches the control bit;

determine that a particular bit of a second digital code outputted by the ADC does not match the control bit; and suppress a respective counter of the plurality of counters from incrementing in response to determining that the particular bit of the second digital code does not match the control bit.

18. The device of claim 17, wherein the interleaving controller is configured to cause the respective counter to increment by delivering an enable signal to a decoder, and wherein the interleaving controller is configured to suppress the respective counter from incrementing by delivering a disable signal to a decoder.

19. The device of claim 15, wherein the scan-out circuit is configured to output the counts stored by the plurality of counters during a pause in the non-linearity testing.

20. The device of claim 15, wherein the plurality of counters is arranged in rows and columns, the device further comprising:

a row decoder configured to:

receive a first portion of a digital code outputted by the ADC; and enable a row of the plurality of counters in response to receiving the first portion of the digital code; and a column decoder configured to:

receive a second portion of the digital code outputted by the ADC, the second portion being different than the first portion; and enable a column of the plurality of counters in response to receiving the second portion of the digital code.

* * * * *